(12) United States Patent
Bonora et al.

(10) Patent No.: US 7,798,759 B2
(45) Date of Patent: Sep. 21, 2010

(54) MODULAR TERMINAL FOR HIGH-THROUGHPUT AMHS

(75) Inventors: Anthony C. Bonora, Portola Valley, CA (US); Michael Krolak, Los Gatos, CA (US); Roger G. Hine, Menlo Park, CA (US)

(73) Assignee: Muratec Automation Co., Ltd., Kyoto (JP)

( * ) Notice: Subject to any disclaimer, the term of this patent is extended or adjusted under 35 U.S.C. 154(b) by 1025 days.

(21) Appl. No.: 11/433,980

(22) Filed: May 15, 2006

(65) Prior Publication Data

US 2007/0128007 A1    Jun. 7, 2007

Related U.S. Application Data

(60) Provisional application No. 60/697,785, filed on Jul. 8, 2005, provisional application No. 60/681,389, filed on May 16, 2005.

(51) Int. Cl.
  *B65G 1/00* (2006.01)
(52) U.S. Cl. ............... 414/331.17; 414/940; 198/347.1; 198/435
(58) Field of Classification Search ................ 414/626, 414/940, 268, 285, 331.14, 331.17; 198/347.1, 198/347.3, 435
See application file for complete search history.

(56) References Cited

U.S. PATENT DOCUMENTS

| | | | | |
|---|---|---|---|---|
| 3,403,799 A | * | 10/1968 | Sindzinski et al. | .......... 414/564 |
| 5,411,358 A | | 5/1995 | Garric et al. | |
| 5,473,978 A | * | 12/1995 | Colombo | .................. 99/443 C |
| 5,980,183 A | | 11/1999 | Fosnight | |
| 6,039,169 A | * | 3/2000 | Zaniboni | ................ 198/347.1 |
| 6,089,811 A | * | 7/2000 | Watanabe et al. | ........... 414/269 |
| 6,468,021 B1 | | 10/2002 | Bonora et al. | |
| 6,579,052 B1 | * | 6/2003 | Bonora et al. | .......... 414/222.01 |
| 6,677,690 B2 | | 1/2004 | Fosnight et al. | |
| 6,681,916 B2 | * | 1/2004 | Hiroki | ..................... 198/347.1 |
| 6,955,197 B2 | | 10/2005 | Elliott et al. | |

(Continued)

FOREIGN PATENT DOCUMENTS

JP    2000-124284    4/2000

(Continued)

OTHER PUBLICATIONS

Patent Abstracts of Japan, Dec. 5, 2003, vol. 2003, No. 12.

(Continued)

*Primary Examiner*—Saúl J Rodríguez
*Assistant Examiner*—Joshua I Rudawitz
(74) *Attorney, Agent, or Firm*—Fish & Richardson P.C.

(57) ABSTRACT

The present invention generally comprises an apparatus for transporting containers between a first transport system and a second transport system. In one embodiment, the first transport system comprises a ceiling-based conveyor and the second transport system comprises a floor-based conveyor. The present invention may further include storage shelves, preferably substantially horizontally aligned about a common vertical plane with a section of one of the transport systems. The transport system may be located either directly above the uppermost storage shelf or beneath the lowermost storage shelf in order to add storage capacity within the fab. A vertical module transports containers between the transport systems and the at least one storage shelf.

31 Claims, 16 Drawing Sheets

U.S. PATENT DOCUMENTS

| | | | |
|---|---|---|---|
| 6,979,168 B2* | 12/2005 | Uchimaki et al. | 414/217.1 |
| 6,990,721 B2* | 1/2006 | Mariano et al. | 29/469 |
| 7,032,736 B2* | 4/2006 | Guidetti et al. | 198/347.1 |
| 7,168,905 B1* | 1/2007 | Solomon et al. | 414/237 |
| 7,364,028 B2* | 4/2008 | Moriya et al. | 198/347.1 |
| 2001/0043849 A1* | 11/2001 | Perlov et al. | 414/222.01 |
| 2002/0187024 A1* | 12/2002 | Nulman | 414/217 |
| 2003/0161714 A1* | 8/2003 | Blattner et al. | 414/935 |
| 2004/0081546 A1 | 4/2004 | Elliott et al. | |
| 2004/0091338 A1* | 5/2004 | Kim | 414/217 |
| 2004/0109746 A1 | 6/2004 | Suzuki | |
| 2004/0166689 A1 | 8/2004 | Wakabayashi et al. | |
| 2007/0264114 A1* | 11/2007 | Ma et al. | 414/560 |

FOREIGN PATENT DOCUMENTS

| | | |
|---|---|---|
| JP | 2000 124284 A | 4/2000 |
| JP | 2004 238089 A | 8/2004 |

OTHER PUBLICATIONS

Patent Abstracts of Japan, Sep. 29, 2000, vol. 2000, No. 07.

International Technology Roadmap for Semiconductors (ITRS 2003), Factory Integration Chapter, *Material Handling Backup Section*, 2003 Public Presentation, Sep. 4, 2003.

* cited by examiner

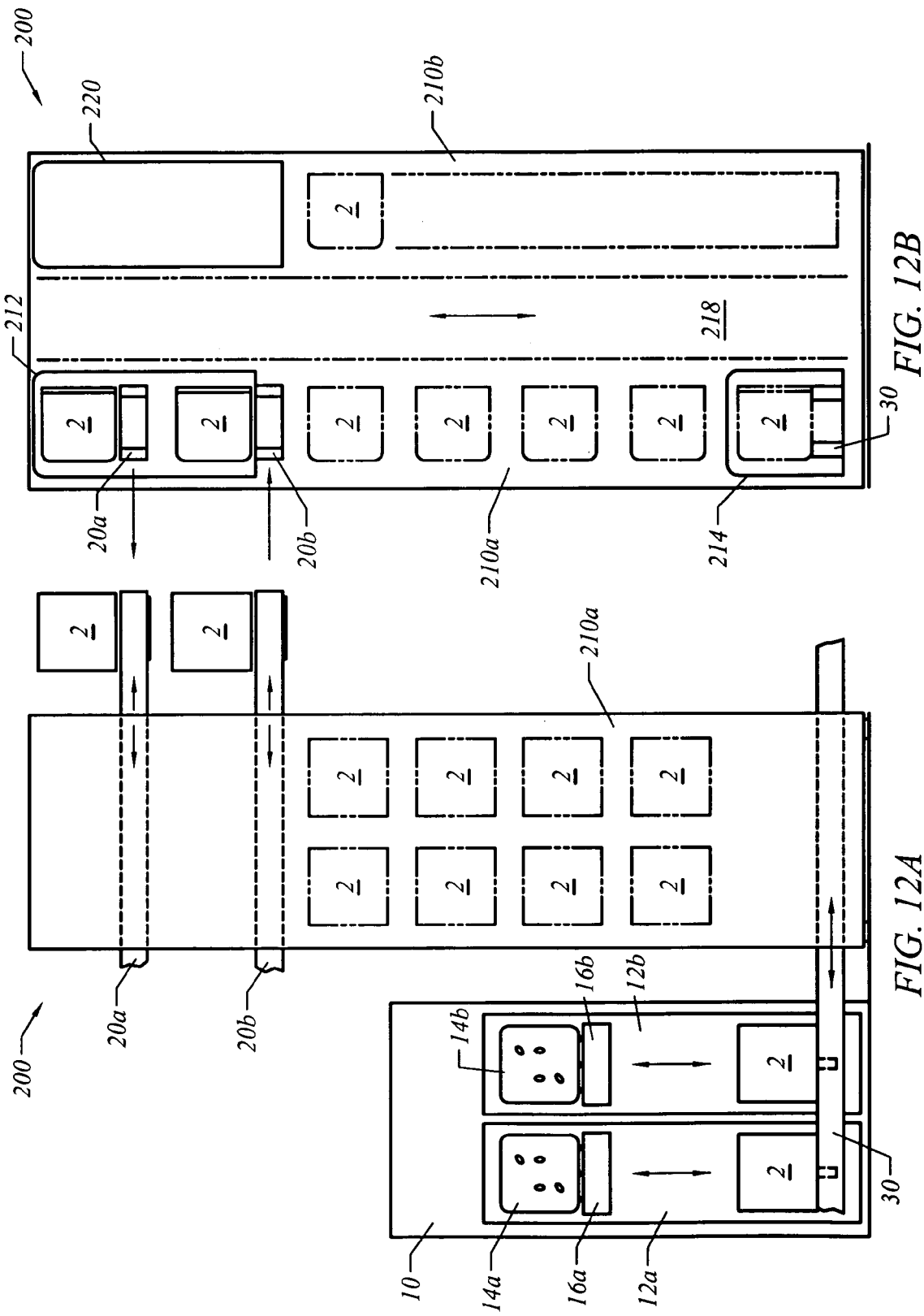

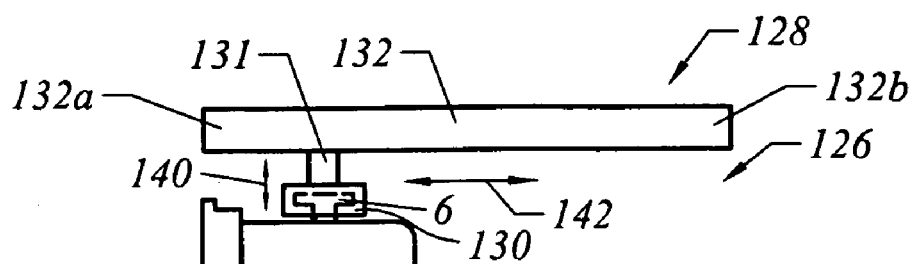
FIG. 13A
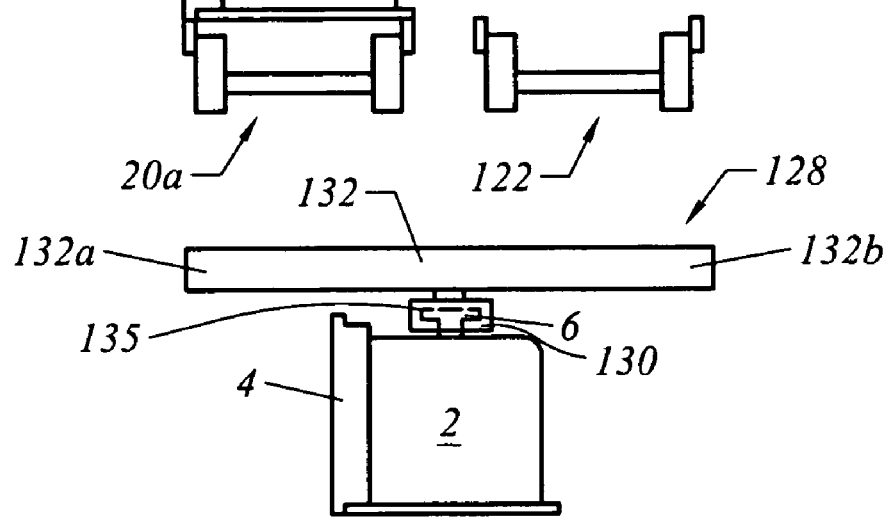
FIG. 13B
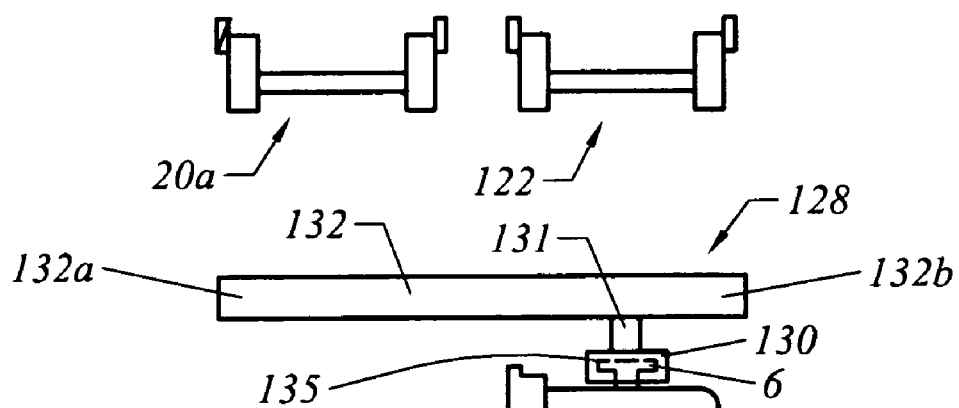
FIG. 13C
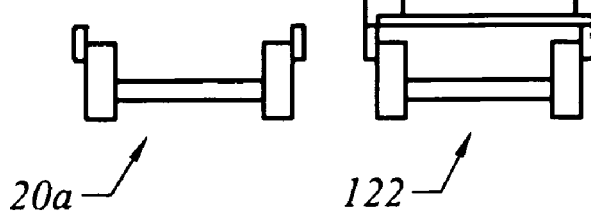

MODULAR TERMINAL FOR HIGH-THROUGHPUT AMHS

CLAIM OF PRIORITY

This application claims priority under 35 U.S.C. §119(e) to U.S. Provisional Patent Application No. 60/697,785, entitled "Modular Terminal for High Throughput AMHS," which was filed with the U.S. Patent & Trademark Office on Jul. 8, 2005, and U.S. Provisional Patent Application No. 60/681,389, entitled "Integrated Terminal for High Speed AMHS," which was filed with the U.S. Patent & Trademark Office on May 16, 2005, both assigned to Applicant and both incorporated in its entirely by reference herein.

FIELD OF THE INVENTION

The present invention generally comprises a modular terminal or transfer module for, among other things, storing, sorting, identifying containers and transporting containers between transport systems. More specifically, the present invention provides an apparatus for moving containers between a ceiling-based transport system and a floor-based transport system.

BACKGROUND OF THE INVENTION

It is costly to deliver containers 2, such as Front Opening Unified Pods (FOUPs) and Standard Mechanical Interface (SMIF) pods, to processing tools 10 and load ports 12 in a semiconductor fabrication facility (fab). One method of delivering FOUPs and SMIF pods between processing tools is an Automated Material Handling System (AMHS).

An AMHS or transport system moves containers or cassettes of semiconductor wafers or flat panels (all referred to as containers herein) in a fab. Container movement within the fab may be within each tool bay (e.g., bays B1 and B2 in FIG. 1) (intrabay AMHS—generally comprises a transport system that moves containers within a bay and delivers containers to tool locations.) and between tool bays (interbay AMHS—generally comprises a transport system that moves containers along a main aisle that connects bays of processing tools.). Fabs often include stockers for storing containers. It is desirable to decrease delays in AMHS traffic by delivering containers directly from processing tool to processing tool as much as possible. Inadequate throughput capability in any part of the AMHS may cause other parts of the AMHS to have throughput that is below potential because the inadequate component is serially connected to the other parts.

Containers are often delivered to a stocker after a process step is completed and then later removed and delivered to another tool when the tool is ready. The limited throughput of a conventional stocker limits the entire throughput capacity of the systems that deliver and remove containers from a stocker. Thus, the overall throughput capacity of the AMHS is limited to the stocker throughput. For example, peak interbay transport throughput for a particular stocker may be 700 container or AMHS moves per hour. If this stocker is accessed by two AMHS for bidirectional transport, a potential peak interbay move rate of 1400 container moves per hour for that particular stocker may theoretically be achieved. If this stocker is further connected to another tool bay having an intrabay AMHS or other transport system with a 700 container moves per hour peak capacity, the peak moves rate for the stocker could reach up to 2100 container moves per hour. A conventional stocker can only make one container move every twenty seconds on average—limiting the peak throughput of the stocker to 180 container moves per hour, which is well below what may be required by the fab.

Even if only considering the throughput of the bay, and the stocker only handles container flow into the bay, the peak requirement could be 1400 moves per hour (700 moves per hour from interbay, 700 moves per hour to intrabay). This situation would cause the high potential throughput of the intrabay to be severely limited by the stocker.

Asyst Technologies, Inc. manufactures various high throughput systems, including the Direct Tool Loading system disclosed in U.S. patent application Ser. No. 11/064,880, entitled "Direct Loading Tool," which is assigned to Asyst Technologies, Inc., and is incorporated by reference herein. The Direct Tool Loading system may also create this kind of throughput mismatch with conventional stockers. The Direct Tool Loading system is a floor-based container transport system (e.g., a container transport system that transports a container at an elevation equal to or lower than the processing tool loading height). Such a system requires a vertical transport process even if containers were delivered directly to the tools without first being stored in a stocker (different container delivery priorities). The combination of very high throughput stockers and vertical container transport systems are required to fully utilize the throughput potential of the Direct Load system. Conventional stocker limitations may not be readily apparent in some AMHS because the AMHS itself also has a limited throughput (not high throughput).

One type of AMHS or transport system is an overhead transport (OHT) system. In a conventional OHT system, an OHT vehicle, among other things, lowers a FOUP onto the kinematic plate of the load port at approximately 900 mm height from the fabrication facility floor. An OHT system uses sophisticated ceiling mounted tracks and cable hoist vehicles to deliver FOUPs to these load ports. The combination of horizontal moves, cable hoist extensions, and unidirectional operation, must be coordinated for transporting FOUPs quickly between processing tools. For optimum efficieny within an OHT system. an OHT vehicle must be available at the instant when a processing tool needs to be loaded or unloaded. This is not always possible.

Other non-conveyor AMHS or transport systems that use a vehicle to move containers throughout the fab (e.g., automated guided vehicle (AGV) system, rail guided vehicle (RGV) systems, overhead shuttle (OHS) systems) require the AMHS scheduling system to manage the movement and availability of empty vehicles as well as the loaded vehicles that are making deliveries. This heavy burden on the scheduling system often results in container pick-up delays because empty vehicles are directed to the pick-up location and added traffic congestion results due to non-productive empty vehicle movement. Similar delays occur with OHT vehicles. The OHT vehicle may take, for example, fifteen seconds to complete the container pick-up or drop-off step, and during this pick-up/drop-off time, container traffic is blocked at that location of the AMHS. These factors combine to limit vehicle based intrabay AMHS to, for example, 100-200 moves per hour in many cases. This does not present a large mismatch with conventional stocker capabilities. However, many tool bays require much higher throughput that cannot be met with the conventional stocker/OHT architecture.

Asyst's Direct Tool Loading system provides an AMHS solution for high throughput intrabay tool delivery capability. The Direct Tool Loading system provides several advantages for throughput: extension of high throughput conveyor AMHS directly to the tool, and, due to individual load port conveyor load/unload mechanisms, highly parallel conveyor interfaces. At any given time, many containers may be in the process of being dropped off onto the conveyor or picked-up from the conveyor with no mutual interference. To fully utilize its throughput potential, the AMHS requires a combination of high throughput stockers and vertical transport systems that efficiently connects to the interbay AMHS in flexible configurations that meet varying fab configurations.

Therefore, there is a need for improved high-throughput container transport systems and storage capabilities within a fab. The present invention provides such a system.

SUMMARY OF THE INVENTION

One aspect of the present invention is to provide a modular terminal or transfer device for moving containers between AMHS or other transport systems that are located at different heights from the facility floor. In one embodiment, the modular terminal comprises at least one vertical module for transferring containers between a ceiling-based transport system and a floor-based transport system. In another embodiment, the modular terminal also includes at least one storage shelf aligned directly underneath a section of a ceiling-based transport system for temporarily storing containers. These storage shelves are optional, and may comprise either passive (cannot move a container) and/or active storage shelves (can move a container).

Another aspect of the present invention is to provide a modular terminal that optimizes the container flow of an interbay AMHS or transport system. Such a modular terminal enables extremely high interbay to intrabay transfer rates. In one embodiment, the present invention includes a pull-over loop for temporarily storing containers downstream of the modular terminal until a vertical module becomes available. The present invention may also include a lane-jumper for transferring containers between the transport system and the pull-over loop. The modular terminal may also accommodate sorting and metrology functions.

Yet another aspect of the present invention is to provide a modular terminal that supports the expedited delivery of high priority containers. In one embodiment, each vertical module housing is located adjacent the ceiling-based transport system so that a priority container traveling on the ceiling-based transport system may pass unobstructed by the modular terminal. In another embodiment, the lane jumper in the system quickly removes containers from the AMHS to minimize traffic congestion on the ceiling-based AMHS.

Another aspect of the present invention is to provide a modular terminal that supports inter-floor container transport in multi-floor fabs. For example, a fabrication facility may include a first fabrication floor and a second fabrication floor located above the first floor—each having an independent AMHS or transport system. A single vertical module, passing through the ceiling of the first floor, may transfer containers between the two independent transport systems located on completely different floors.

Still another aspect of the present invention is to provide a modular terminal that is easy to install and has a low maintenance cost. A modular terminal may be applied to any preexisting AMHS or transport system. In one embodiment, the modular terminal may be installed adjacent to the preexisting AMHS (e.g., adjacent an OHT track) without interfering with the AMHS. And additional vertical modules may be added to the modular terminal. In another embodiment, the modular terminal includes a pass-through zone that encompasses a portion of the preexisting AMHS yet allows containers to pass unobstructed through the modular terminal.

BRIEF DESCRIPTION OF THE DRAWINGS

FIGS. 12A-12B are front and side elevation views of another embodiment of the present invention;

FIGS. 13A-13C illustrate one embodiment of a lane-jumper, in accordance with the present invention;

DETAILED DESCRIPTION OF THE INVENTION

For exemplary purposes only, the present invention will be described herein in conjunction with transporting FOUPs. The various embodiments of the present invention may also be used and/or adapted for systems handling SMIF pods, reticle containers, flat panel display transport devices, or any other container or processing tool. Container is defined as any structure for supporting an article including, but not limited to, a semiconductor substrate of any size (e.g., 50 mm to 500 mm wafers). By way of example only, a container includes a structure that comprises an open volume whereby the article can be accessed (e.g., FPD transport) or a container having a mechanically openable door (e.g., bottom opening SMIF pod and FOUP). Load port is defined as any interface equipment that handles containers.

Figure 1:
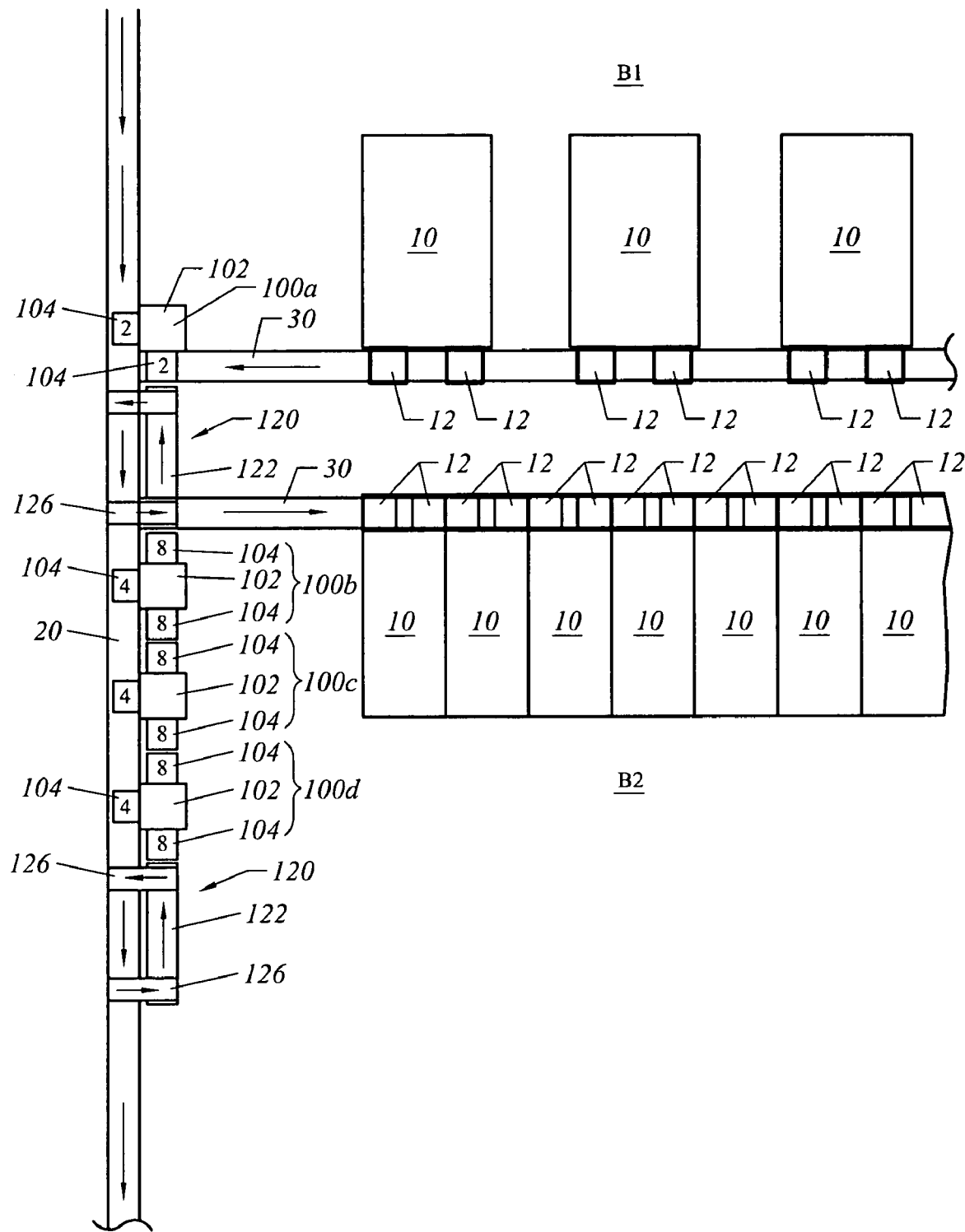
FIG. 1 is a schematic view of an AMHS utilizing one embodiment of the present invention.

The present invention will also be described in conjunction with conveyors for ease of describing the various embodiments. The present invention may also operate, of course, with other AMHS or other transport system such as an OHT vehicle, an overhead shuttle (OHS), an RGV or an AGV. FIG. 1 illustrates an AMHS including a ceiling-based or interbay conveyor 20, a floor-based or intrabay conveyor 30 and multiple modular terminals 100.

FIG. 1 illustrates two intrabay conveyors 30, each transporting containers between load ports 12 within its respective tool bay (e.g., tool bays B1 and B2). An arrow indicates the direction that the intrabay conveyor transports containers. However, it is within the scope of the present invention for each intrabay conveyor to comprise a bi-directional conveyor. The configuration shown in FIG. 1 is only exemplary. Other configurations are covered by the present invention. A ceiling-based conveyor 20 relates to any type of conveyor that transports containers 2 at an elevation above the loading height of a load port 12. A floor-based conveyor 30 relates to any type of conveyor that transports containers 2 at an elevation equal to and below the loading height of a load port 12.

FIG. 1 illustrates that each modular terminal 100, regardless of the configuration, includes a vertical module 102 for transporting containers 2 between a ceiling-based AMHS or transport system and a floor-based AMHS or transport system. The terms AMHS and transport system are interchangeable in this description. A modular terminal 100 may also include vertically stacked storage shelves 104 to add a storage feature to the modular terminal 100. In FIG. 1, each set of storage shelves 104 are labeled with a number (e.g., 2, 4, 8) that represents the total number of vertically stacked storage shelves 104 at that specific location. For example, modular terminal 100b includes three sets of storage shelves—two sets of shelves 104 having eight shelves each and one set of storage shelves 104 having four shelves. As will be discussed later, a modular terminal 100 may include any number of storage shelves 104 (including no shelves) and any number of vertical modules 102.

Figure 2:
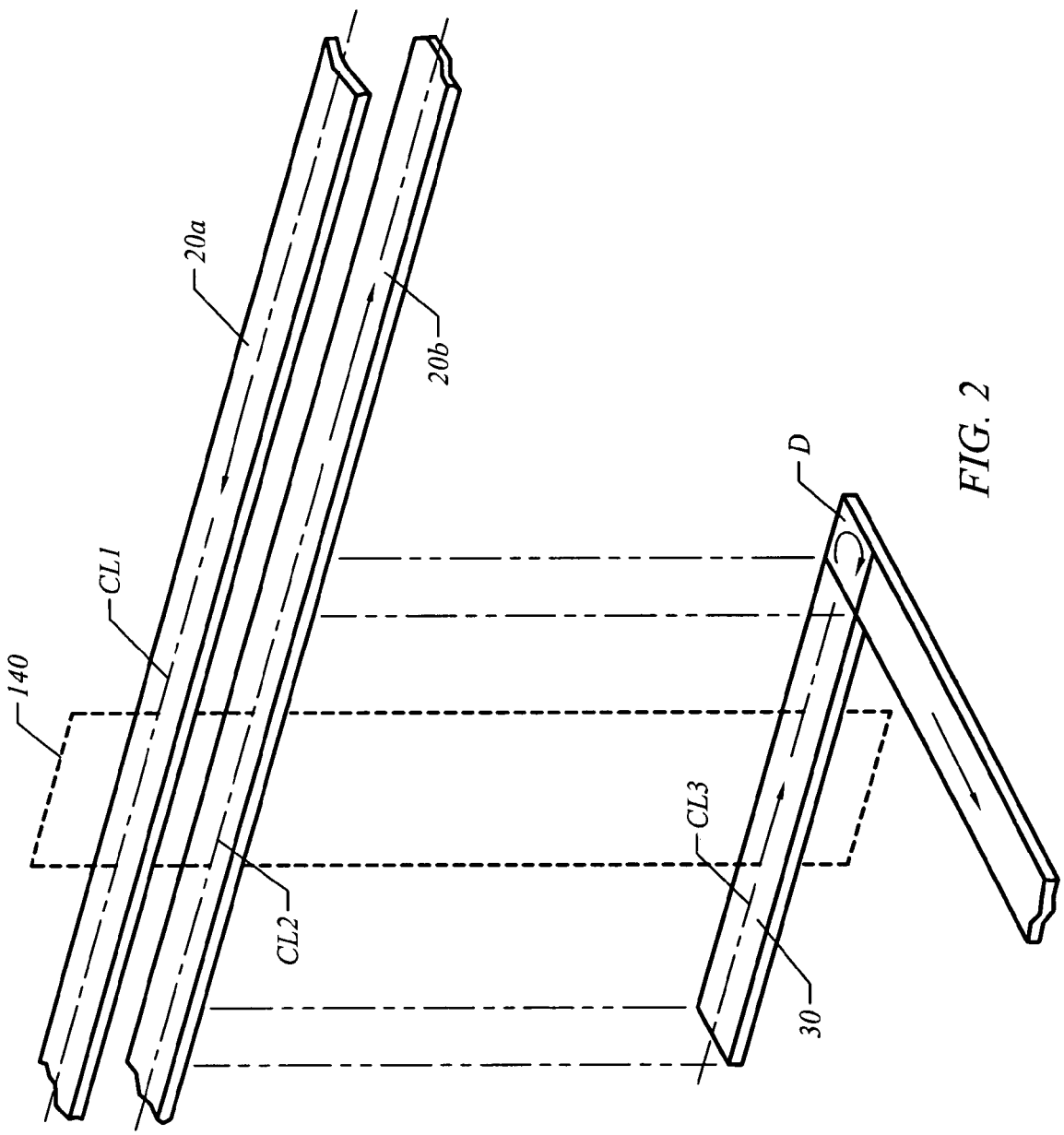
FIG. 2 is an isometric view illustrating one embodiment of a physical relationship between an interbay conveyor and an intrabay conveyor.

FIG. 2 illustrates one embodiment of a ceiling-based conveyor 20. In this embodiment, the ceiling-based conveyor 20 comprises an upper conveyor 20a and a lower conveyor 20b. The two conveyors 20a and 20b are stacked vertically such that the longitudinal centerlines CL1 and CL2 of each conveyor are substantially horizontally aligned about a common vertical plane 140. In this embodiment, each ceiling-based conveyor 20a and 20b moves a container 2 in a single direction (indicated by right and left arrows in FIG. 2). Each conveyor 20a and 20b is substantially horizontally aligned with the floor-based intrabay conveyor 30 (e.g., CL1, CL2 and CL3 are substantially horizontally aligned about a common vertical plane). FIG. 2 provides only one embodiment of the spatial relationship between the upper interbay conveyor 20a, the lower interbay conveyor 20a and the intrabay conveyor 30. Other configurations are also within the scope of the present invention. FIG. 2 illustrates that the floor-based conveyor 30 may also include a director D for rotating a container 90° between segments of the conveyor. One example of a director D is disclosed in U.S. Pat. No. 6,308,818, entitled "Transport System with Integrated Transport Carrier and Director," which is assigned to Asyst Technologies, Inc., and is incorporated in its entirety by reference herein.

As will be explained in more detail later, the vertical module 102 includes a transfer mechanism that may extend horizontally to the conveyor (either interbay or intrabay conveyors), engage a container 2 (e.g., by the bottom surface or the top handle of the container), lift a container 2 off the conveyor, place a container on the conveyor, and move a container 2 into/out of and within the vertical module 102. If the transfer mechanism cannot rotate (e.g., about a theta axis), the transfer mechanism is limited to storing containers 2 only in storage shelves/locations 104 that are located between the interbay and intrabay conveyors (e.g., FIG. 4 embodiment) or at a location on the opposite side of the vertical module 102 (e.g., FIG. 9 embodiment). To store a container 2 to a side of the vertical module 102 (e.g., storage shelves 104 in modular terminal 100b labeled with numeral 8 in FIG. 1), the transfer mechanism may require theta or linear motion about two different axes. This would greatly increase the storage density of the modular terminal 100. However, any storage locations on the side of the vertical module 102 opposite the interbay conveyor 20 may not be very desirable because the locations may block service access to the vertical module 102 and decrease usable tool space in the tool bay.

FIG. 1 illustrates a modular, expandable architecture with a capability that can cover a wide range of intrabay throughput requirements. The modular terminal 100 could be configured with only a single vertical module 102 and a minimum number of storage shelves/locations 104. The vertical module 102 may also be configured without any storage shelves 104 and used solely for inter-conveyor transportation (e.g., between a ceiling based conveyor and a floor-based conveyor). A single vertical module 102 (with or without storage shelves), with a transfer mechanism having theta, vertical and horizontal motion, may eliminate the section of floor-based or intrabay conveyor 30 (shown in FIG. 2) that lies directly beneath the interbay conveyor 20.

The transfer mechanism in the vertical module 102 can move a container 2 in many directions. For example, in the FIG. 5 embodiment, the transfer mechanism may raise to the level of the upper interbay conveyor 20a, extend a gripper or other device outward to engage the container 2, raise the gripper upward to lift the container 2 off the interbay conveyor 20, move the container 2 into the vertical module 102, drop to the level of the desired storage shelf 104 or the floor-based conveyor 30, and place the container 2 directly on the shelf 104 or floor-based conveyor 30. In the FIG. 5 embodiment, each shelf 104 comprises a conveyor for moving a container 2 in either direction on the shelf (as shown by the arrows). In the FIG. 9 embodiment, the transfer mechanism would remove a container 2 from the upper conveyor 20a (or lower conveyor 20b) and move the container 2 into the vertical module 102. The transfer mechanism would then lower the container 2 down to storage shelf 104e, for example, and place the container 2 on the storage shelf 104e. Many other movements of a container are within the scope of the present invention.

FIG. 1 also illustrates an embodiment of a pull-over loop 120. Each pull-over loop 120 may be positioned either upstream or downstream of a modular terminal 100 to provide a temporary storage area. A pull-over loop 120 may be positioned anywhere along the conveyor. For example, a pull-over loop may be positioned adjacent only the upper interbay conveyor 20a or a pull-over loop 120 may be positioned adjacent both the upper interbay conveyor 20a and the lower interbay conveyor 20b. If a vertical module 102 was not available as a container 2 approached the modular terminal 100, the AMHS could quickly transfer the container 2 from the conveyor to the pull-over loop 120. Moving the container off of the conveyor avoids stopping the interbay conveyor 20 until the vertical module 102 is ready to accept the container. Other containers on the conveyor could then pass the pull-over loop 120 and continue moving towards their destination. When then vertical module 102 is ready for the container, the container could then be placed back onto the conveyor without interrupting the flow of the AMHS.

Devices such as a director or a lane-jumper 126 (shown in more detail in FIGS. 13-15) may transfer a container 2 between the interbay conveyor 20 and the pull over loop 120. A pull-over loop 120 generally comprises a conveyor 122 for temporarily buffering arriving containers 2. Other mechanisms known within the art for buffering containers are also within the scope of the invention. A lane-jumper 126 generally comprises any mechanism that transfers a container 2 between two conveyors (e.g., between the pull-over loop conveyor 122 and the interbay conveyor 20) or other AMHS. For example, a container 2 traveling on the ceiling-based conveyor 20 is briefly stopped, gripped, lifted off the interbay conveyor 20, and then moved over the pull-over loop conveyor 122. A mechanism for transferring the container 2 between conveyors could comprise, for example, a single or multi-segmented arm or a linear slide. A separate mechanism could be used to lift the container from underneath, allowing more variations in the design of the lateral transfer mechanism. Other robotic mechanisms known within the art for transferring containers are within the scope of the invention.

The descriptions above refer to a vertically stacked interbay conveyor 20 (e.g., upper interbay conveyor 20a and lower interbay conveyor 20b) because it eliminates delays experienced by conventional planar interbay conveyors. The interbay conveyor 20 will, however, most efficiently deliver containers if the container motion is uni-directional. Multiple parallel interbay conveyors 20 also increase the interbay AMHS throughput. It is preferable to have at least one conveyor for each interbay direction to efficiently transfer containers between any two bays (see FIG. 4 embodiment). Conventional planar interbay conveyor architecture does not allow a container traveling on the conveyor located further from the tool bay to enter the tool bay without intersecting the conveyor closer to the tool bay. The positions where conveyor flow is diverted or where conveyor flow crosses another conveyor would require a director, and interbay throughput would be degraded by the traffic interruptions. Of course, this is not true if a conveyor was placed on both sides of a vertical module 102 (see FIG. 10B).

Figure 3:
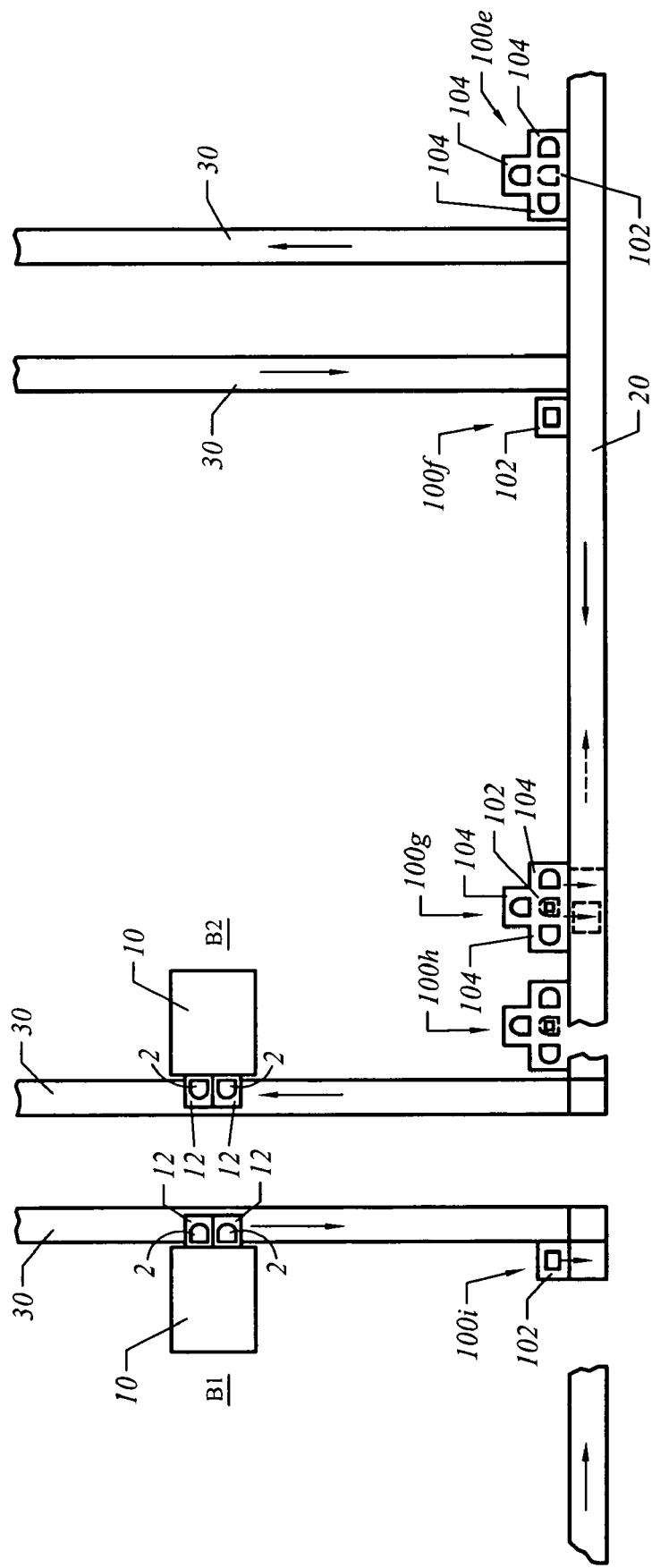
FIG. 3 is a plan view of an AMHS with an interbay to intrabay junction, according to one embodiment of the present invention.

FIG. 3 illustrates another AMHS utilizing various components of the present invention to improve the overall throughput of containers within the fabrication facility. The AMHS includes a ceiling-based conveyor 20, multiple floor-based conveyors 30 and tool bays B1 and B2. Several modular terminals 100 are placed along the ceiling-based conveyor 20. The locations of the modular terminals 100 and the other components of the AMHS are for exemplary purposes only. FIG. 3 illustrates that the containers 2 may be stored in the AMHS with the modular terminals 100.

Figure 4:
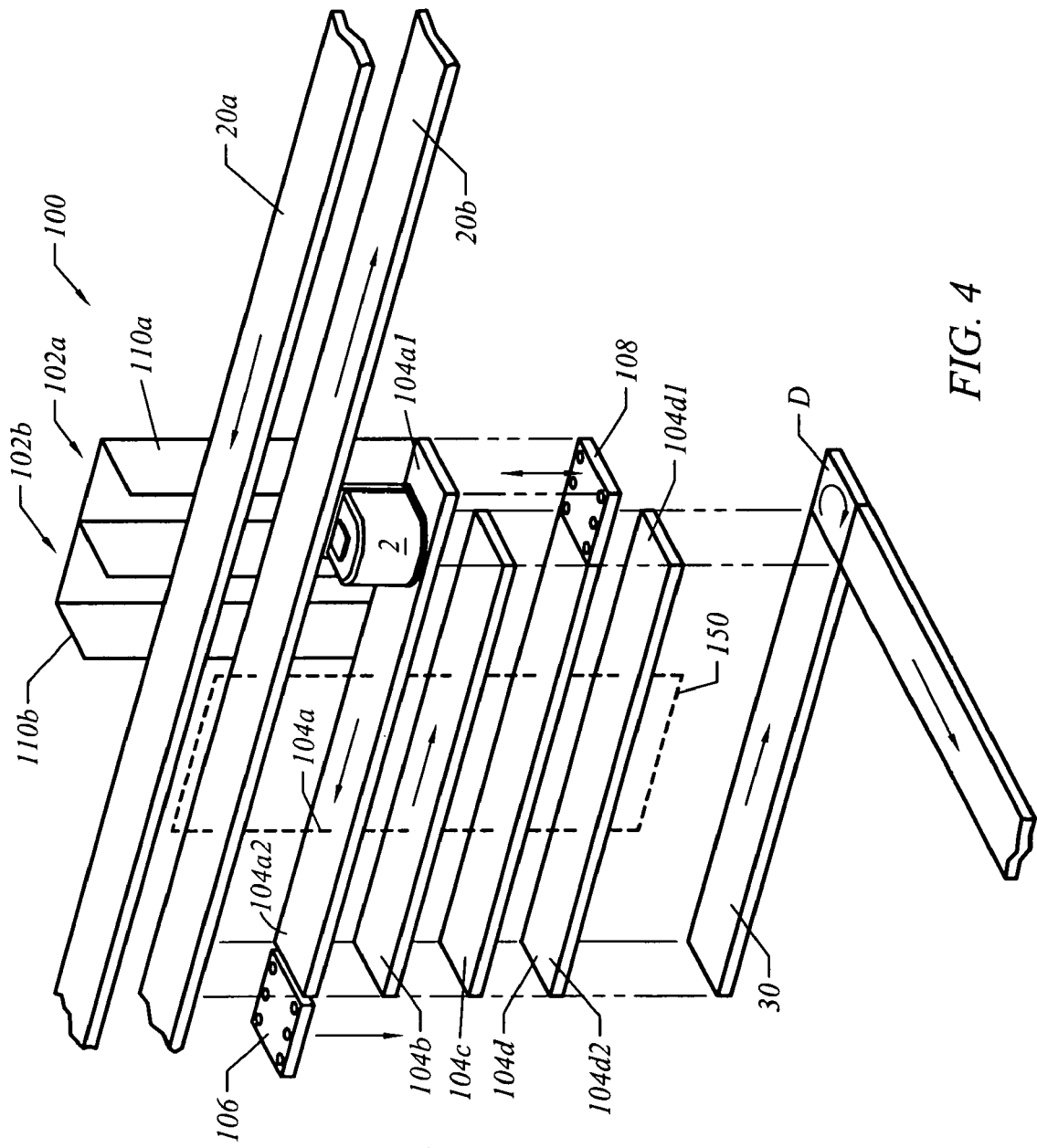
FIG. 4 is an isometric view of an embodiment of the present invention.

FIGS. 4-7 illustrate various combinations of modular terminals 100 that provide, among other things, vertical transfer, storage and buffering of containers 2. Again, the vertical module 100 may include no storage shelves. FIG. 4 illustrates one embodiment of modular terminal 100 providing several space saving features. In this embodiment, the modular terminal 100 includes a first vertical module 102a, a second vertical module 102b, four storage shelves 104a-104d, a first transfer platform 106 and a second transfer platform 108. FIG. 4 illustrates that the interbay conveyors 20a and 20b, and the storage shelves 104a-104d, are each horizontally aligned with a vertical plane 150. The modular terminal 100 may, of course, have other configurations.

FIG. 4 illustrates that each vertical module 102 comprises a housing 110 that extends between the upper interbay conveyor 20a and the uppermost storage shelf 104a. The housing 110 of each vertical module 102 does not have to extend between the same interbay conveyor 20 or storage shelf 104, and does not have to be adjacent each other. In fact, the modular terminal 100 may only include a single vertical module 102. And the modular terminal 100 may include any number of storage shelves 104 (including none). A transfer mechanism (not shown in FIG. 4) travels within each housing 110 to move a container 2 between the conveyor(s) and the storage shelves 104.

Each storage shelf 104 shown in FIG. 4 comprises a conveyor for moving a container 2 between anywhere along the storage shelf. For example, the storage shelf 104a is able to move a container 2 between the first end 104a1 and the second end 104a2. The uppermost shelf 104a, similar to the other storage shelves 104b-104d, may be a unidirectional or a bidirectional conveyor.

The modular terminal 100 shown in FIG. 4 moves a container from either the upper conveyor 20a or the lower conveyor 20b initially to the uppermost storage shelf 104a. After the container 2 is placed on the uppermost storage shelf 104a, the container 2 may be moved to another storage shelf (e.g., shelves 104a, 104b, 104c and 104d in FIG. 4) by either transfer platform 106 or a combination of transfer platforms 106 and 108. The transfer platform 106 will eventually lower the container 2 down to the floor-based conveyor 30.

More than one vertical module 102 in a single modular terminal 100 improves the efficiency of the modular terminal 100. For example, containers can be unloaded with higher throughput from the interbay conveyor 20 because there are multiple transfer mechanisms working in parallel. The scalable, parallel architecture reduces the average time it takes to remove containers from the ceiling-based conveyor 20. The transfer platforms 106 and 108 are preferably positioned in-line with the end of each storage shelf 104 and located directly underneath the interbay conveyor 20. The transfer platforms may be located in other positions too. Having vertical modules 102a and 102b that are long enough to load only the uppermost storage shelf 104a (highest elevation) also allows floor traffic under the shortened frames 110 of each vertical module 102 (e.g., an operator may walk under the vertical modules without hitting his/her head on the frame).

Each vertical module 102 may also directly access any number of the storage shelves 104a-104d. The vertical modules 102 could, for example, move a container 2 directly between the ceiling-based conveyor 20 and the floor-based conveyor 30. In another embodiment, full-length vertical modules 102 could be mounted to the sides of each storage shelf 104 to replace the in-line platforms 106 and 108. The vertical modules 102 shown in FIG. 4 illustrate that the platform 106 may access all of the storage shelves 104a-104d while the platform 108 cannot access the uppermost storage shelf 104a. The two transfer platforms prevents each storage shelf 104 from operating as a first in, first out (FIFO) system. Containers stored on, for example, a storage shelf 104 may exit either the first end 104d1 to transfer platform 108 or exit the second end 104d2 to the transfer platform 106. Each transfer platform 106 and 108 preferably comprises a bidirectional conveyor in order to be able to move a container 2 between itself and a storage shelf 104.

Figure 5:
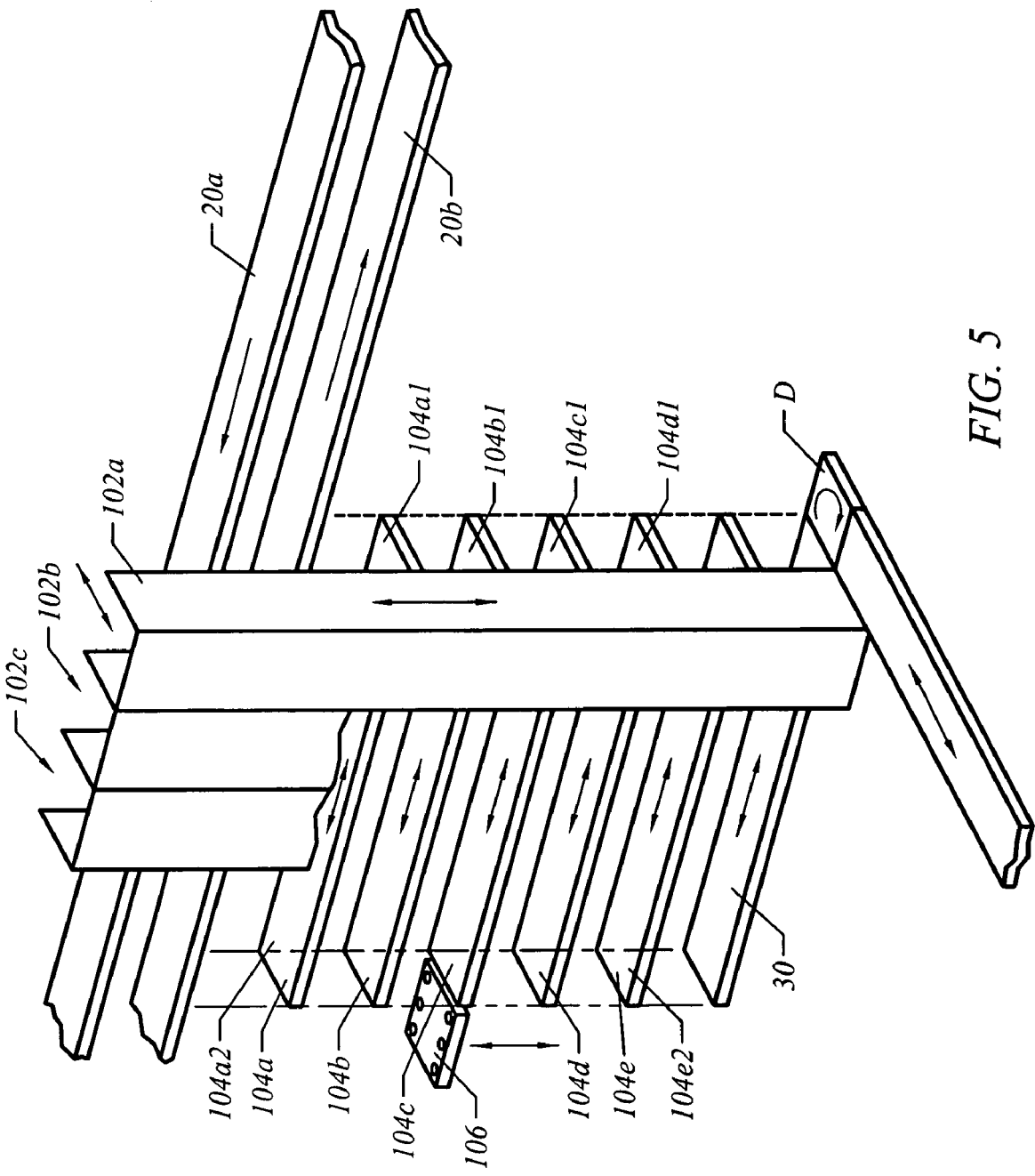
FIG. 5 is an isometric view of another embodiment of the present invention.

FIG. 5 illustrates an upper ceiling-based conveyor 20a and a lower ceiling-based conveyor 20b linked with multiple vertical modules 102a-102c, and an optional platform 106. Each vertical module 102a-102c may be located on the near side of the ceiling-based conveyor 20 (as shown in FIG. 5), on the far side of the ceiling-based conveyor 20 (similar to FIG. 4), or on both sides of the ceiling-based conveyor 20. In one embodiment, the method of operation comprises a first-in, first-out ("FIFO") method that provides buffering, but not true random access storage. In operation, a vertical module 102 transfers a container 2 from one of the interbay conveyors 20a or 20b to one of the vertically stacked storage shleves 104a-104e. The storage shelf 104 then moves the container 2 to the end of the storage shelf towards the platform 106 (see arrows in FIG. 5). The container 2, after placed on the platform 106, is then transferred to the floor-based conveyor 30.

The container 2 may be transferred from a storage shelf 104 to the floor-based conveyor 30 by either by the platform 106 or a vertical module 102 (if the vertical module 102 extends to a the floor-based conveyor 30). For example, vertical module 102a may extend between the ceiling-based conveyor 20 and the floor-based conveyor 30. The vertical module 102b may extend from the ceiling-based conveyor 20 to the storage shelf 104c. And the vertical module 102c may extend from the ceiling-based conveyor 20 only to the uppermost storage shelf 104a. Other configurations of the vertical modules 102 are within the scope of this invention. A vertical module 102 could also be positioned at either end of the storage shelves 104. For example, a vertical module 102 could replace the platform 106. A vertical module 102 could also be located at the other end of the storage shelves 104. The transfer mechanism in each vertical module 102 may comprise a short section of conveyor or a transfer mechanism (e.g., container handling robot) for transferring the container 2 between the vertical module 102 and the storage shelf 104. It is also within the scope of the invention to place an interbay conveyor 20 or additional storage shelves 104 (see FIG. 9 configuration) on either side of each vertical module 102 (see FIG. 10B configuration).

Figure 6:
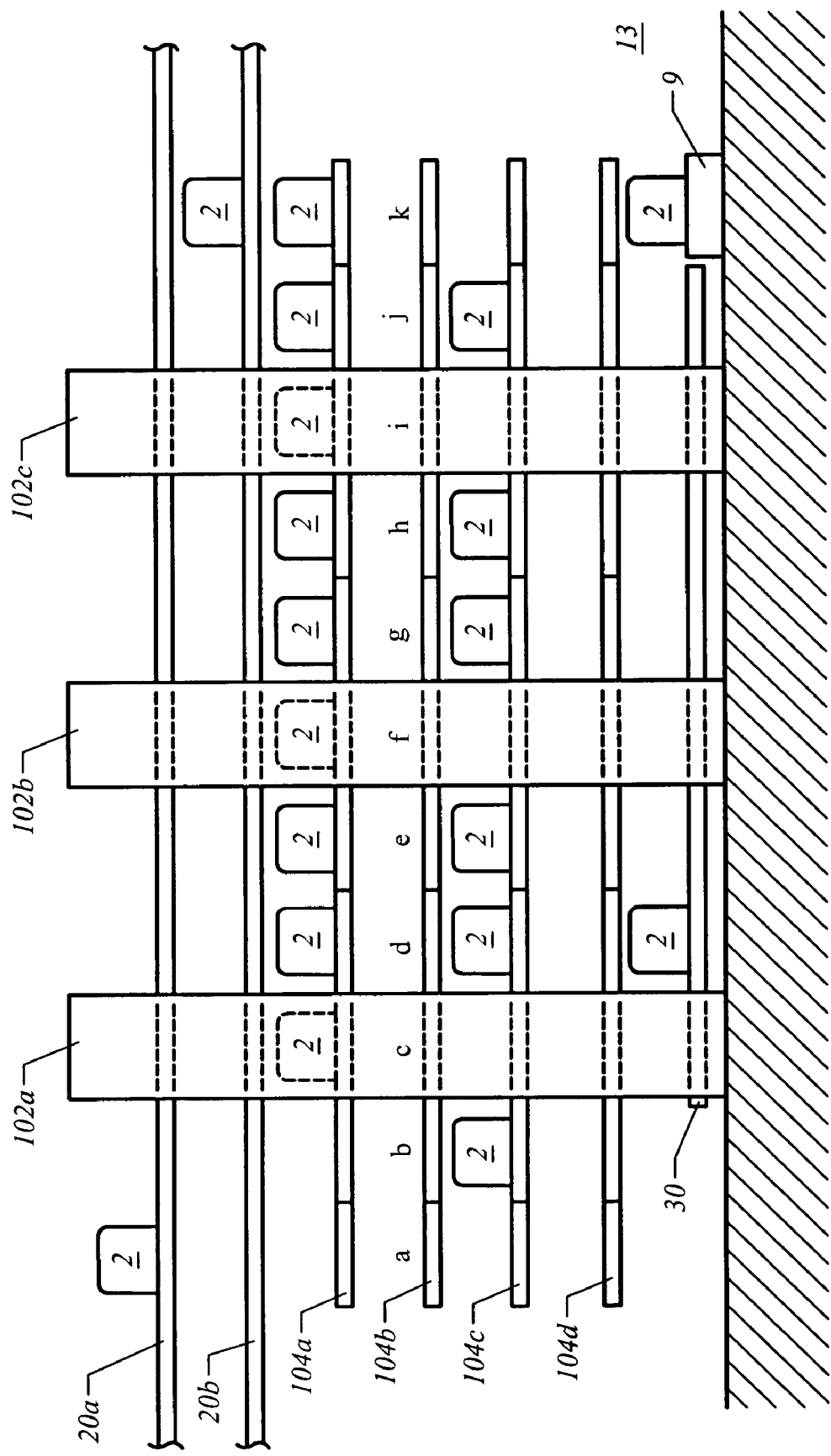
FIG. 6 is a schematic view of an embodiment of a random access container storage system, according to the present invention.
Figure 7:
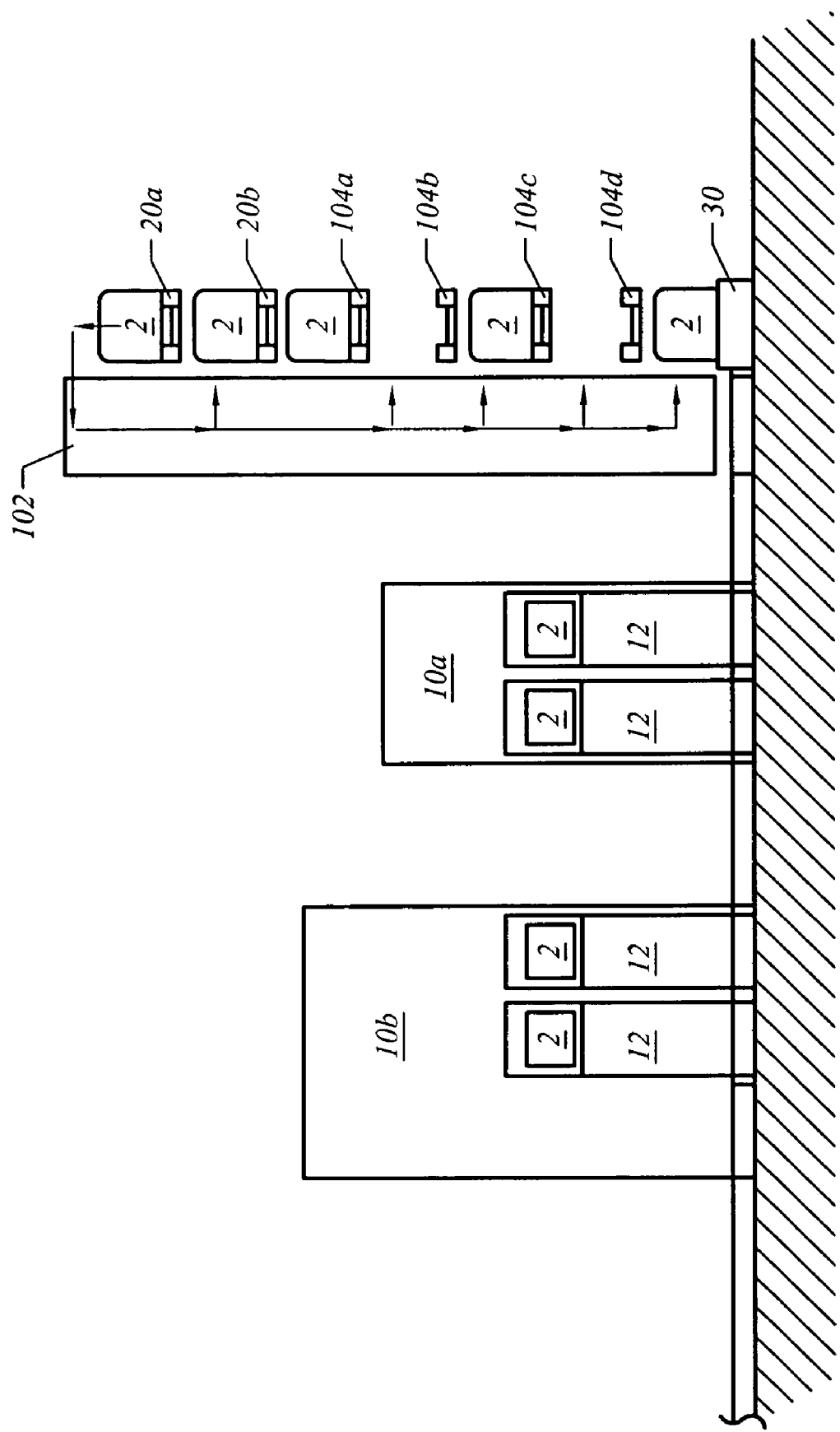
FIG. 7 is side view of the embodiment shown in FIG. 6, illustrating the storage system in relation to a tool bay.

FIGS. 6-7 illustrate a random access container storage system does not use a vertical module 102 located at either end of the storage conveyors 104. Vertical modules 102a-102c connect interbay conveyors 20a and 20b with storage shelves 104a-104d as well as floor-based conveyor 30. Containers 2 are shown on all levels of the storage shelves 104 except storage shelves 104b and 104d. Individual storage positions along storage shelves 104a-104d are identified with letters a through k. The floor-based intrabay conveyor 30 may be the same as the conveyor shown in FIG. 2, but is not limited to that embodiment. Tool bays require an aisle space, which is shown in FIG. 6 as aisle space 13. Processing tools 10a and 10b are shown in FIG. 7. Each storage shelf 104 requires a certain minimum number of open spaces so that the containers 2 stored on the storage shelf 104 can be moved laterally to either vertical module 102a, 102b or 102c for eventual delivery to the floor-based conveyor 30. The FIG. 6 embodiment of the storage system includes an equal number of storage locations between each vertical module 102 (e.g., two storage locations between each vertical module 102 are shown) as each storage shelf 104 extends beyond the vertical modules 102 at the ends for additional container storage. The storage system may also have other configurations to store more/less containers.

For modular terminals 100 that have an equal number of storage locations between each vertical module 102 (e.g., locations d and e) and storage locations extending beyond each vertical module 102 (e.g., locations j and k), the maximum number of storage locations (defined as M) per storage shelf 104, by way of example only, has been determined to be:

$$M=T-E=N*(X+1)$$

N=Number of vertical modules in the storage system;
X=Number of container storage locations located between each vertical module or at the end of the storage conveyor section;
T=N*(X+1)+X=Total number of container storage locations per storage conveyor level; and
E=minimum number of container storage locations left empty per storage conveyor level.

Other formulae for calculating the maximum number of storage locations are within the scope of the invention. This type of modular terminal 100 could be optimized for maximum storage density, maximum storage or throughput by varying the number of vertical modules 102 and their spacing.

FIG. 6 illustrates that the storage shelf 104a has a maximum number of storage locations occupied by containers 2 that still allow for any of the containers 2 to be removed from storage shelf 104a. For example, if the container 2 stored in location k needs to be unloaded from storage shelf 104a, all nine containers must be shifted to the left two locations to move the container 2 stored in location k to location i. Location i is accessible by vertical module 102c and therefore, the container 2 may be moved off of storage shelf 104a to another storage shelf 104, a ceiling-based conveyor 20 or the floor-based conveyor 30. Not all of the containers 2 stored on storage shelf 104a always have to be moved to place a container 2 in a vertical module accessible position. For example, if the container 2 stored in location e has to be unloaded from storage shelf 104a, only the containers stored in locations c, d, and e have to be shifted two positions to the left to move the container 2 stored in location e to location c, which is accessible by vertical module 102a. The remaining containers 2 stored in locations f-k do not have to be shifted at all.

Storage shelf 104c has less than the maximum number of storage locations occupied by a container 2, and the containers 2 are stored in the most efficient locations. For example, any of the containers 2 stored on storage shelf 104c may be retrieved without having to move the other containers 2. The optimum operation of this type of modular terminal 100 positions containers 2 only in the locations that would, on average, allow retrieval of a container 2 with the minimum shifting of the other containers 2. In one embodiment, a container 2 received by a vertical module 102 would then be unloaded onto the storage shelf 104 that had the fewest containers. In another embodiment, the modular terminal 100 would continually shift the containers 2 on a particular storage shelf 104 to the "optimum" positions while the storage shelf 104 is not being accessed—such as the arrangement of containers 2 as shown on storage shelf 104c.

Figure 8:
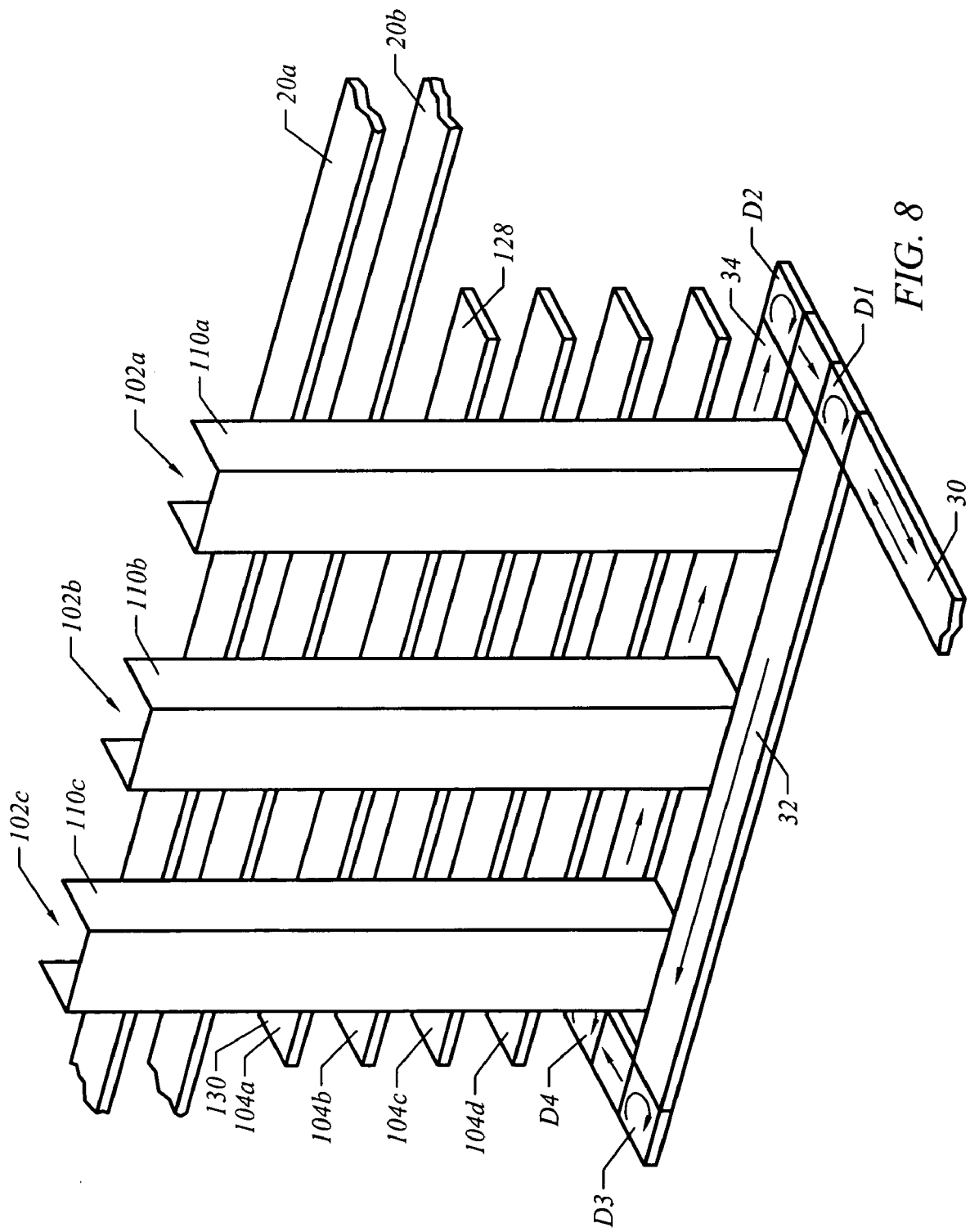
FIG. 8 is an isometric view of yet another embodiment of the present invention.
Figure 9:
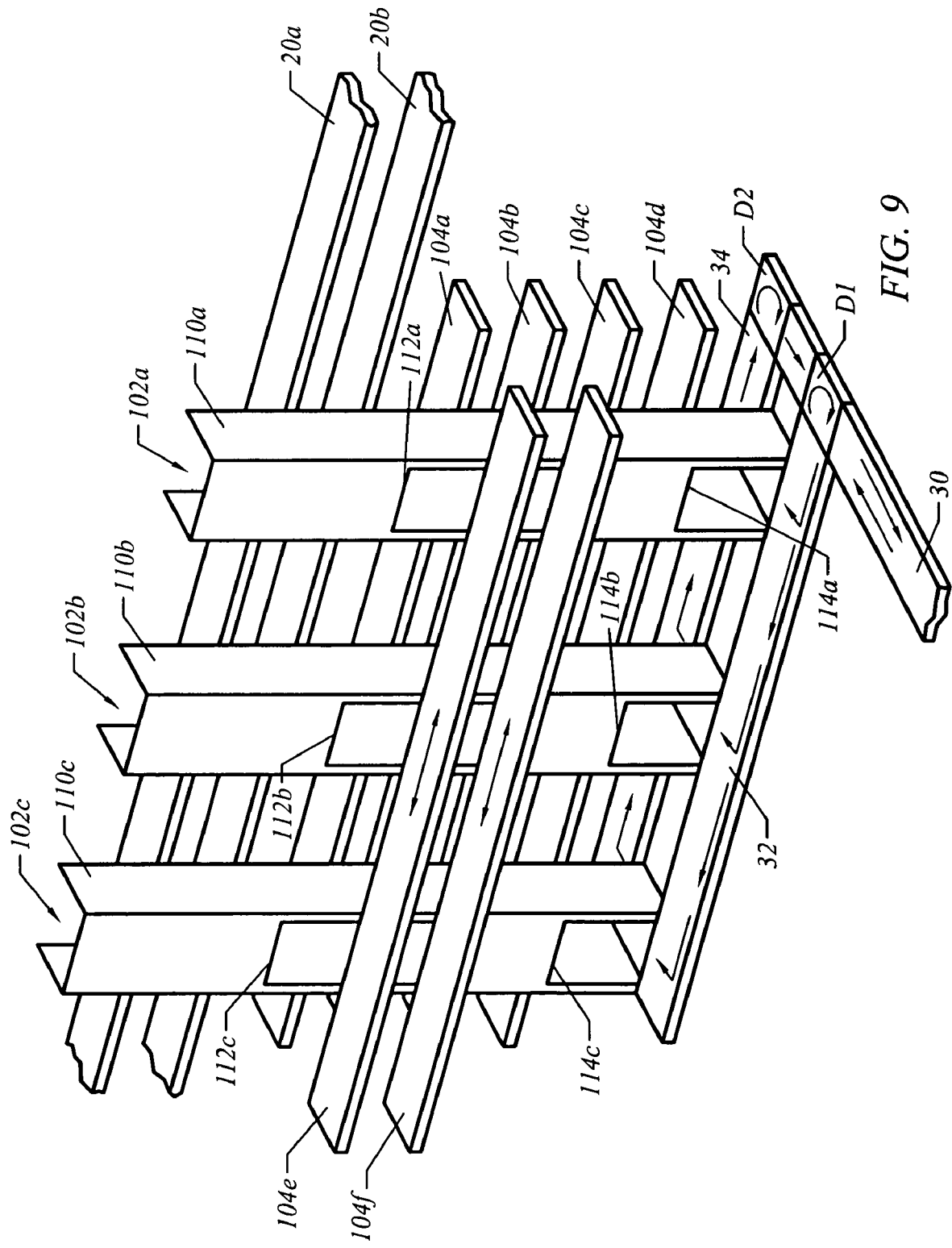
FIG. 9 is an isometric view of still another embodiment of the present invention.

FIGS. 8-9 illustrate various configurations of floor-based conveyors 30 to support a bi-directional section of intrabay conveyor and how the modular terminal 100 may service this type of conveyor. FIG. 8 illustrates that a container 2 exiting the tool bay on the bi-directional floor-based conveyor 30 will turn at director D1, move across the exit conveyor section 32, turn at director D3 and then move to director D4. In one embodiment, the containers 2 then wait for a vertical module 102 to become available, and at that time, move from director D4 to the available vertical module 102 for transport to the interbay conveyor 20 or a storage shelf 104. Exiting containers 2 could also form a queue on the exit conveyor section 32, allowing for optimum synchronization with the operation of the vertical modules 102.

Containers entering the tool bay from the vertical module 102 would move along the entrance conveyor section 34, turn at director D2, and then engage the bi-directional floor-based conveyor 30 at director D1. The entrance conveyor section 34, up to director D2, could be used as an input queue for containers. The intrabay AMHS would control the sequence move directions on the floor-based conveyor 30. The intrabay AMHS may change the bi-directional conveyor direction to "entrance" direction, and then move all containers 2 in the entrance queue. After that, the intrabay AMHS could switch the direction to "exit" direction and move all containers 2 that have been waiting at processing tools or other stockers. It is also within the scope of the invention to switch operation of the bi-directional conveyor 30 based on time intervals or a queue method that has a time limit for each direction.

FIG. 9 illustrates a system similar to FIG. 8, except that the exit conveyor section does not connect to the entrance section through D1 and D2. Instead, each one of the vertical modules 102 includes a mechanism that is capable of accessing both the exit conveyor section 32 and the entrance conveyor section 34. Exiting containers 2 would queue on the exit conveyor section 32 and directly be unloaded by the vertical module transfer mechanism rather than loop around to the entrance conveyor section 34 as shown in FIG. 8. Having a transfer mechanism in the vertical modules that can access both the entrance conveyor 34 and exit conveyor 32 also allows more storage conveyors—here shown as storage shelves 104e and 104f—to be stacked on the exit conveyor side of the vertical modules 102. For clarity only, two of these added storage conveyor sections are shown, but there could be one opposite each of the storage conveyors on the entrance side (e.g., storage shelves 104a-104d), plus one opposite each of the interbay conveyors 20a and 20b (not shown).

Figure 10A:
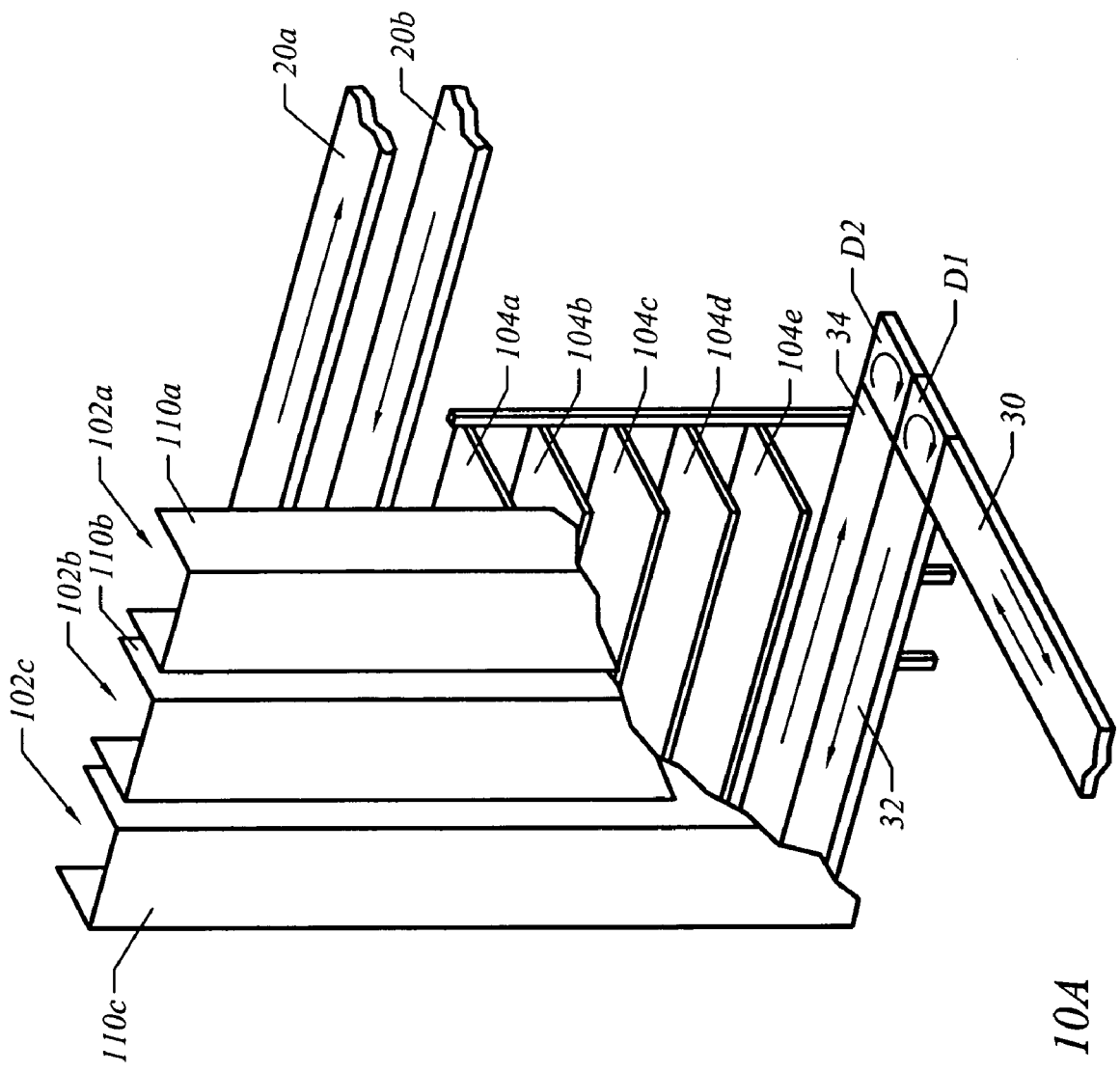
FIGS. 10A-10B provide isometric views of another embodiment of the present invention.

As previously discussed above, these configurations of floor-based conveyors or other transport systems (e.g., AGV, RGV, etc.) that support a floor-based conveyor 30 are not limited to stacked conveyor storage systems as shown in FIGS. 8-9. For example, FIG. 10A illustrates five storage shelves 104a-104e that are each located below the interbay conveyors 20a and 20b. Each vertical module 102a, 102b and 102c access a different column of the storage shelves 104a-104e and the entrance conveyor section 34. The containers 2 may be moved between the ceiling-based conveyors 20, the storage shelves 104 and the entrance conveyor section 34, by way of example only, with an extending mechanism or robotic arm assembly. The mechanism/assembly is well known within the art and does not require further description in this application. In one embodiment, each vertical module 102 may also pick up a container 2 from the exit conveyor section 32 directly below it.

Figure 10B:
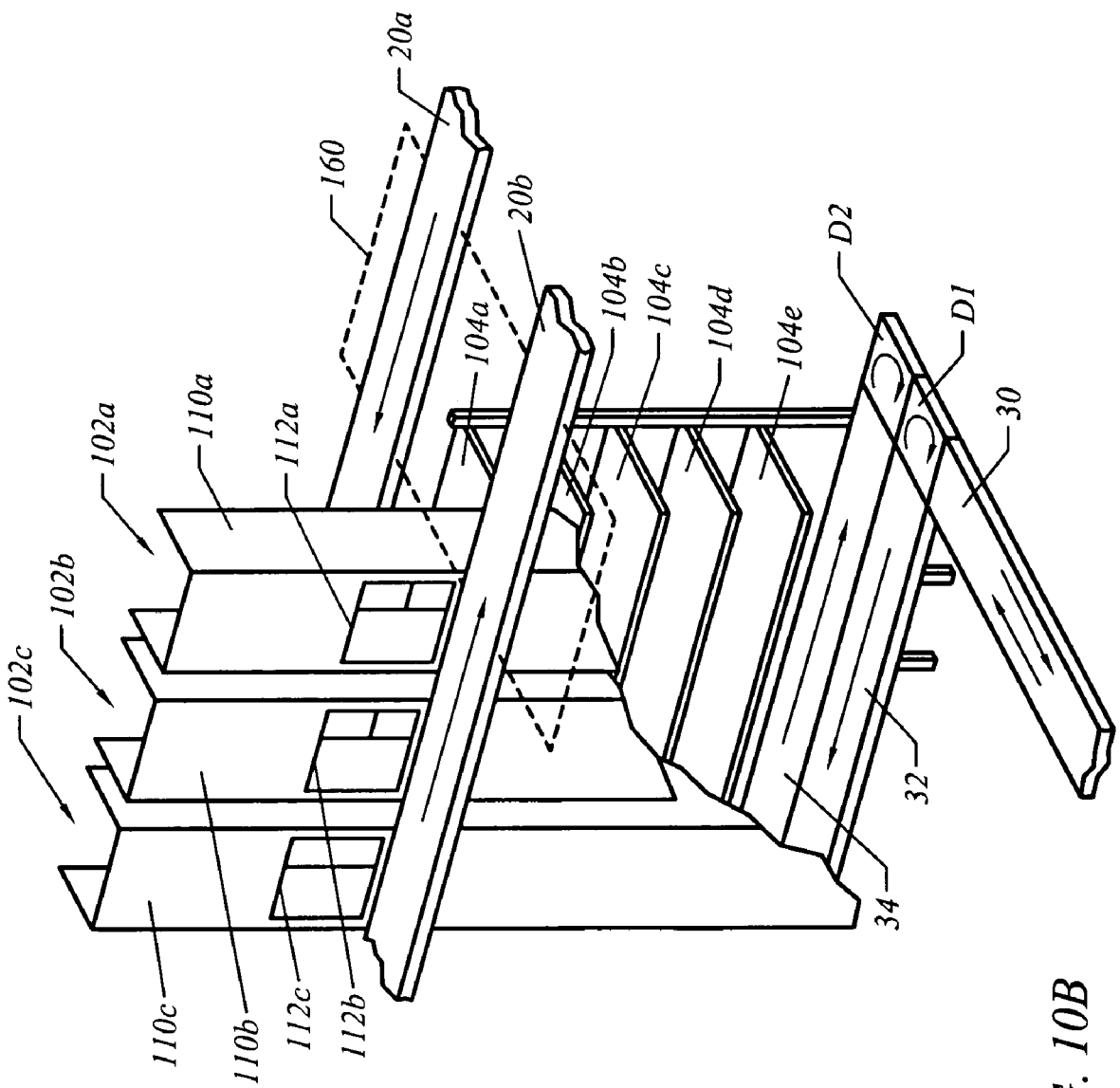

The interbay conveyors 20 discussed above have been vertically stacked, in-line conveyors. It is within the scope of the present invention for the interbay conveyors 20 to have other configurations—including vertically stacked conveyors that are not in-line and/or conveyors that are adjacent to each other at substantially the same height from the facility floor. For example, the two interbay conveyors 20 shown in FIG. 10A may be vertically stacked (as shown in FIG. 10A). The two interbay conveyors 20 may alternatively each be located at substantially the same elevation from the facility floor and spaced apart so that the vertical modules 102 are located between the two interbay conveyors 20 (see FIG. 10B). FIG. 10B illustrates that the interbay conveyor 20a and interbay conveyor 20b are vertically aligned about a common horizontal plane 160. The two interbay conveyors are not required to be located at the same elevation.

Figure 11:
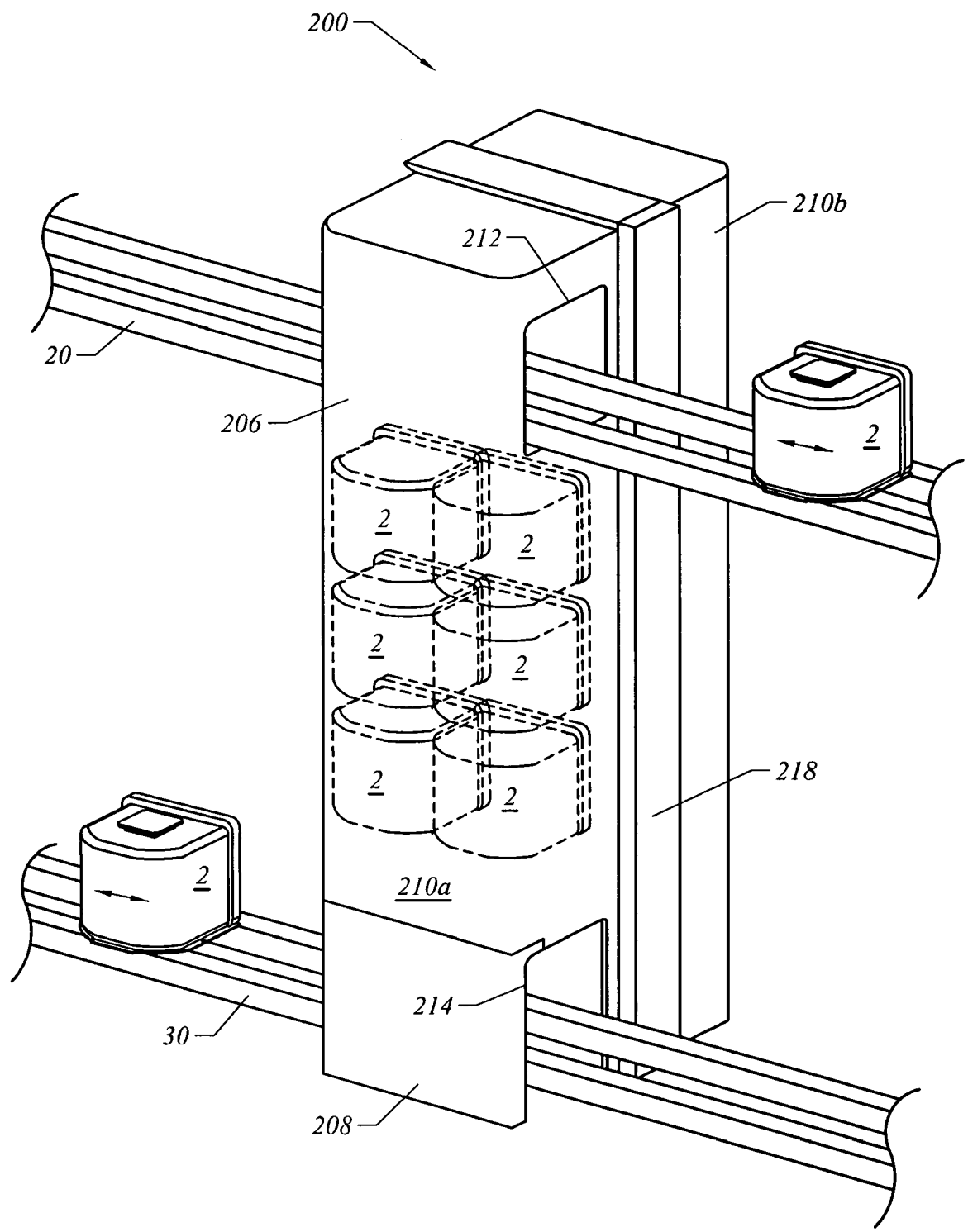
FIG. 11 is an isometric view of yet another embodiment of the present invention.

FIG. 11 illustrates another embodiment of the present invention—modular terminal 200. Similar to the embodiments described above, the modular terminal 200 may be placed anywhere along an AMHS system. The AMHS system shown in FIG. 11 again includes a ceiling-based conveyor 20 and a floor-based conveyor 30. These two conveyors may be an interbay conveyor or intrabay conveyor.

The modular terminal 200 includes an upper pass-through zone 206, a lower pass-through zone 208 and a storage compartment 210. The upper pass-through zone 206 allows the upper conveyor 20 to pass unobstructed through the modular terminal 200. The lower pass-through zone 208 allows the lower-conveyor 30 to pass unobstructed through the modular terminal 200. Hence, containers 2 traveling on the respective conveyor may also pass unobstructed through the modular terminal 200.

FIG. 11 illustrates that the modular terminal 200 includes two storage compartments 210a and 210b. In this embodiment, each storage compartment 210 includes multiple storage shelves (not shown), and each storage shelf stores two containers 2 side by side. The modular terminal 200 may include only one storage shelf or more than two storage shelves. It is also within the scope and spirit of the present invention for the transfer mechanism of the modular terminal 200 to transport a single container or transport multiple containers simultaneously. The storage compartments 210 may have other configurations (e.g., more/less shelves, store more than two containers each, etc.). The two storage compartments 210a and 210b increases the storage capacity of the modular terminal 200. The modular terminal 200 may also include only one storage compartment 210. In an embodiment of the modular terminal 200 that includes two storage shelves, the transfer mechanism may move two containers simultaneously or comprise two transfer mechanism that may move independently of each other.

FIG. 11 illustrates a single interbay conveyor 20 passing through the upper pass-though zone 206 of the modular terminal 200. However, the AMHS system may have multiple, vertically stacked interbay conveyors 20 (similar to the FIG. 4 embodiment), and each conveyor may pass through the modular terminal 200 in the same manner by adding more pass-through zones 206 to the modular terminal 200.

Not all AMHS systems include two conveyors. For example, a conventional fabrication facility may include only one ceiling-based conveyor 20. In this case, the modular terminal 200 would include only an upper pass-through zone 206 and one or more storage compartments 210. If the modular terminal 200 only includes one storage compartment 210, the storage compartment 210 is preferably located directly underneath the conveyor 20 (e.g., storage compartment 210a) in order to take advantage of the currently unoccupied space in the fabrication facility.

The modular terminals illustrated in FIGS. 4-11 are each an independent and truly modular system. For example, each vertical module 102a, 102b and 102c shown in FIG. 8 includes its own vertical transfer mechanism for moving a container 2 within the particular vertical module 102. If each vertical module 102 has a transfer rate of, for example, 70 container moves per hour, the total container moves per hour for the system shown in FIG. 8 is 210 container moves per hour. By adding a fourth vertical module, the system capacity would increase to 280 container moves per hour. Thus, adding additional vertical modules 102 to the system will not affect the transfer rate of each individual vertical module 102a, 102b and 102c.

A terminal modular 100 including more than one vertical module 102 allows for a flexible control system. For example, a single control system may operate all the vertical modules 102 in the modular terminal 100. In the alternative, each vertical module 102 in the modular terminal 100 may have its own control system. This plug-and-play control environment allows additional vertical modules 102 to be added to a single module terminal 100—providing for easy installation, fast start-up time and simple throughput expansion of a modular terminal 100.

FIGS. 12A-12B illustrate the modular terminal 200 shown in FIG. 11 in relation to a Direct Load tool. FIG. 12A illustrates that each storage shelf in the storage compartment 210a stores two containers. Each shelf in the storage compartment 210a may store only one container or more than two containers. In this embodiment, the containers 2 stored in the storage compartment 210a are located beneath the ceiling based conveyor 20b (see FIG. 12B). A transfer device (not shown) moves containers 2 within the travel zone 218 (see FIG. 12B) between the ceiling-based conveyors 20a and 20b, the storage shelves within the storage compartment 210b and the floor-based conveyor 30. As previously discussed above, the modular terminal 200 is not required to include storage compartments at all. The modular terminal 200 may comprise only a vertical module (e.g., travel zone 218 in FIG. 12B). In operation, a container 2 is moved from either a ceiling-based conveyor 20 or a storage shelf down to the floor-based conveyor 30. The floor-based conveyor 30 may then move the container 2 to either load port 12a, load port 12b or some other location.

FIG. 12B illustrates that a container 2 traveling on each of the three conveyors—the ceiling-based conveyor 20a, the ceiling-based conveyor 20b or the floor-based conveyor 30—passes unobstructed through the modular terminal 200. The pass though zone 212 allows containers traveling on the ceiling-based conveyors 20a and 20b to pass unobstructed through the modular terminal 200. The pass through zone 214 allows containers traveling on the floor-based conveyor to pass unobstructed through the modular terminal 200. FIG. 12B also illustrates that the modular terminal 200 may include a second storage compartment 210b.

FIGS. 13A-13C illustrate one embodiment of a lane-jumper 126 for transferring a FOUP 2 between the ceiling-based conveyor 20a and the pull-over loop conveyor 122. In this embodiment, the lane-jumper 126 comprises a linear transport mechanism 128 including a gripper mechanism 130 and a linear rail or track 132. The gripper mechanism 130, as shown in FIG. 13A, comprises a rigid body 131 and a gripper device 135. The linear track 132 includes a first end 132a and a second end 132b. A drive mechanism (not shown) moves the rigid body 131 along the linear track 132 between the first end 132a and the second end 132b of the track 132. The linear track 132 may be any length as long as the gripper mechanism 130 may engage a container or FOUP 2 seated on both the ceiling-based conveyor 20a and the loop conveyor 122. The linear transport mechanism 128 is not limited to moving a container between a ceiling-based conveyor 20a and a loop conveyor 122. The linear transport mechanism 128 amy also move containers between, for example, two floor-based conveyors, two ceiling-based conveyors, and the like. Both conveyors also do not have to be located at the same elevation from the fabrication floor (as shown in FIGS. 13A-13C).

FIG. 13A illustrates that the gripper mechanism 130 is able to move along a vertical direction (indicated by arrow 140) and a horizontal direction (indicated by arrow 142). FIG. 13A illustrates that the gripper device 135 engages the FOUP's top handle 6. It is within the scope and spirit of the present invention for the gripper 130 to engage other parts of the FOUP such as, but not limited to, the FOUP's side handles or the bottom support plate.

In operation, when the FOUP 2 comes to rest on the ceiling-based conveyor 20a, the gripper device 135 is aligned with the FOUP handle 6 and is vertically lowered (arrow 140) until the gripper device 135 is able to engage and secure the FOUP handle 6. The gripper mechanism 130 then lifts the FOUP 2 off the ceiling-based conveyor 20a. The FOUP 2 is then moved horizontally towards the conveyor 122 (see FIG. 13B) until the FOUP 2 is aligned with the conveyor 122 below. The gripper mechanism 130 then lowers the gripper device 135 until the FOUP 2 is seated on the conveyor 122.

The gripper device 135 may comprise either an active gripping mechanism or a passive gripping mechanism. An active gripping mechanism may comprise, for example, a robotic mechanism that secures or grips the FOUP's top handle 6. A passive gripper device 135 may operate in several ways. For example, the gripper device 135 moves into a "grip position" above the ceiling-based conveyor 20a and waits for a FOUP 2 traveling along the ceiling-based conveyor 20a until the FOUP handle 6 engages the passive gripper device 135. At that point, the gripper device 135 raises vertically and lifts the FOUP 2 off the ceiling-based conveyor 20a. In the alternative, the gripper device 135 waits for a FOUP 2 traveling along a conveyor to come to rest. The gripper device 135 then approaches the FOUP 2 from the side and engages the FOUP handle 6, and then lifts the FOUP 2 from the conveyor. Each type of gripping mechanism is known within the art and therefore, no further description of the mechanisms is required.

FIGS. 13A-13C illustrate one embodiment of a lane-jumper 128 for moving a FOUP 2 between a ceiling-based conveyor 20a and a pull-over loop conveyor 122. The configuration of the conveyors 20a and 122 are for illustrative purposes only. The conveyors 20a and 122 may be located further apart, at different elevations from the fab floor (e.g., conveyor 20a comprises a ceiling-base conveyor while the conveyor 122 comprises a floor-based conveyor), and so on. The lane-jumper 128 may even move FOUPs 2 between any two conveyors. The lane-jumper 128 (and other embodiments of a lane-jumper described herein) is not limited to moving FOUPs between a ceiling-based conveyor 20a and a loop conveyor 122. The lane-jumper may move a FOUP 2 between any two transport systems. If the conveyors 20a and 122 were separated further apart than the width of a FOUP 2, the lane-jumper 128 could temporarily maintain the FOUP 2 between the ceiling-based conveyor 20a and the loop conveyor 122 without obstructing traffic on either conveyor. This feature would allow the lane-jumper 128 to immediately remove a FOUP 2 from the ceiling-based conveyor 20a even if there was no place to put the FOUP 2 on the loop conveyor 122. The FOUP 2 could remain temporarily located between the ceiling-based conveyor 20a and loop conveyor 122 until there was a space available on the loop conveyor 122.

The gripper 130 may comprise either a passive gripper or an active gripper. FIG. 13A illustrates the gripper 130 engaged with the FOUP handle 6. FIG. 13B shows that the gripper 130 has been raised (shown by arrow 140) in order to lift the FOUP 2 off the ceiling-based conveyor 20a, and has begun to move the FOUP 2 towards the loop conveyor 122. In this embodiment, the gripper 130 moves horizontally along a track 132 (shown by arrow 142). FIG. 13C. shows that the lane-jumper 128 has lowered the gripper 130 in order to set the FOUP 2 onto the loop conveyor 122.

Figure 14:
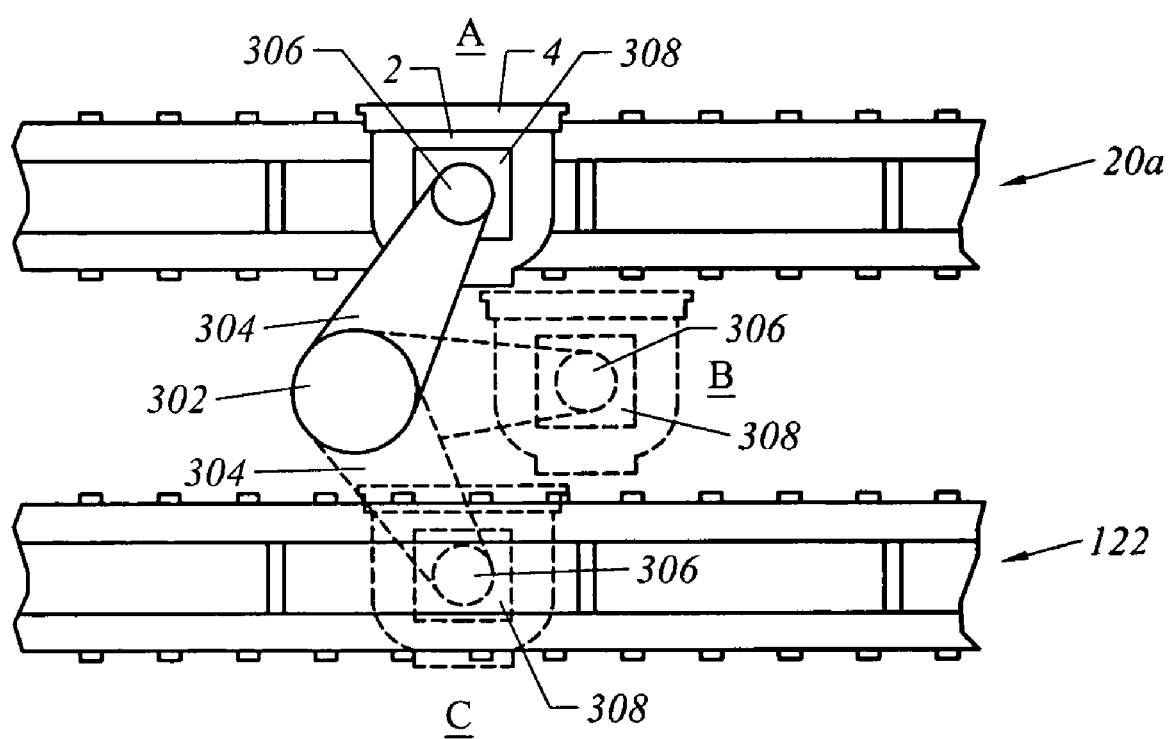
FIG. 14 illustrates another embodiment of a lane-jumper, in accordance with the present invention.

FIG. 14 illustrates another embodiment of a lane-jumper 300. In this embodiment, the lane-jumper 300 includes a rotating arm link rather than a linear mechanism (as shown in FIGS. 13A-13C) to move a FOUP 2 between the ceiling-based conveyor 20a and the conveyor 122. The lane-jumper 300 includes a center hub 302, an arm 304, a wrist joint 306 and a gripper 308. The arm 304 connects the wrist joint 206 to the hub 302. The gripper 306 is rotatably connected to the wrist joint 306. Similar to the lane-jumper 126 shown in FIGS. 13A, the gripper 306 engages the FOUP handle 6. The gripper 306 may also engage or secure other part of the FOUP 2.

The center hub 302 and/or the wrist joint 208 may be able to move vertically in order to raise a FOUP 2 off a conveyor and/or set a FOUP 2 on a conveyor. As shown in FIG. 14, in operation, the gripper 308 engages the top handle 6 of the FOUP 2 seated on the conveyor 20a (shown as position A). At position A, the FOUP 2 is lifted off of the ceiling-based conveyor 20a and rotated to position C (intermediate position B is shown to illustrate the complete motion of the FOUP). The FOUP 2 is then lowered onto conveyor 122. When moving the FOUP 2 from position A to position C, the rotation of the wrist joint 306 is preferably coordinated with the rotation of the center hub 302 in order to maintain the alignment of the FOUP as shown in positions A, B and C (e.g., the FOUP door 4 is constantly facing the same direction). The conveyors 20a and 122 may be separated by any distance. However, the distance between the ceiling-based conveyor 20a and the conveyor 122, as shown in FIG. 14, is a minimum distance that allows the FOUP 2 to remain in position B without obstructing the traffic on either conveyor (e.g., a distance slightly greater than the width of a FOUP).

Figure 15:
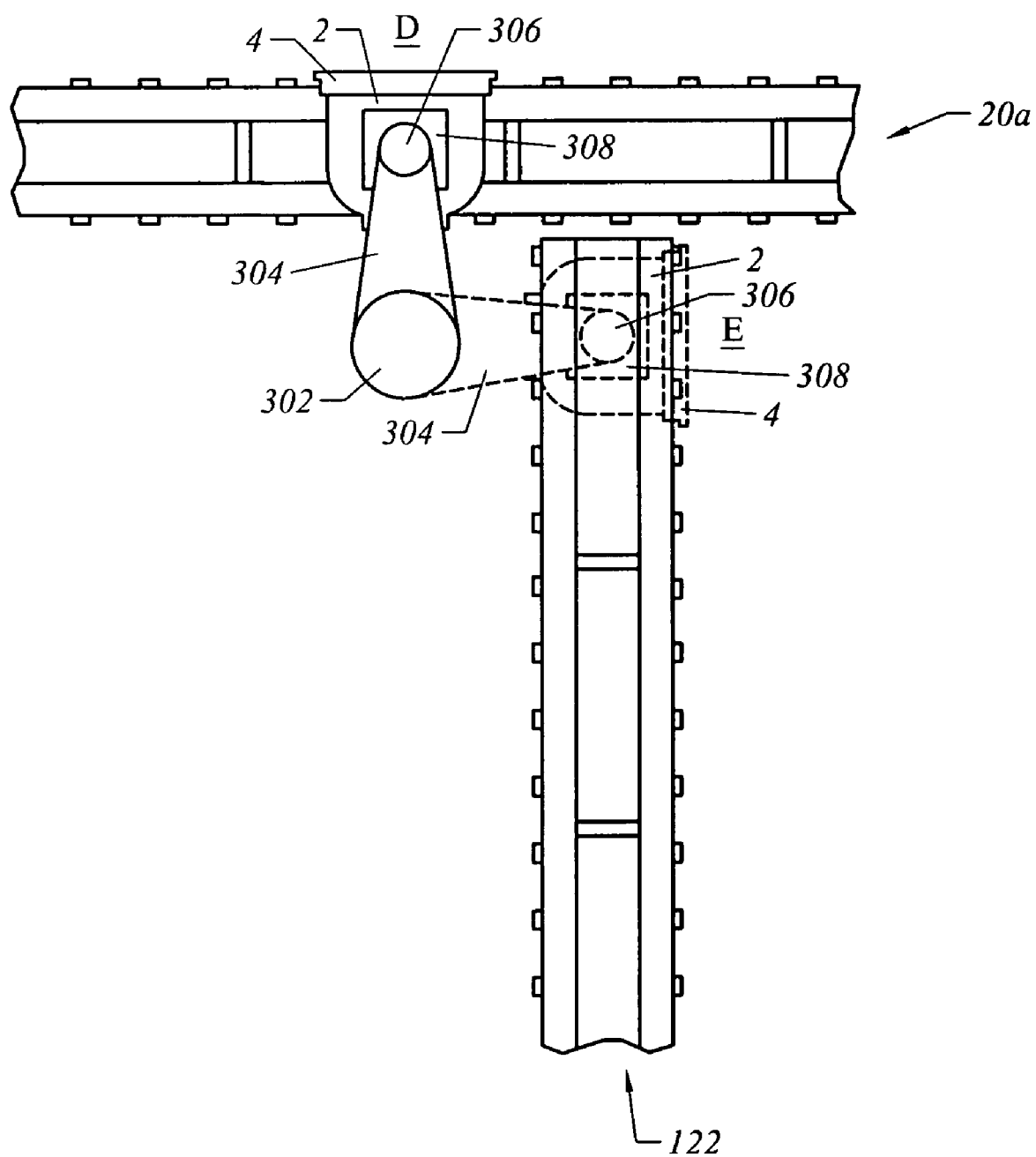
FIG. 15 illustrates the lane-jumper shown in FIG. 14 in operation with another embodiment of a conveyor system.

FIG. 15 illustrates how the lane jumper 300 may also transfer a FOUP 2 between a ceiling-based conveyor 20a and a pull-over loop conveyor 122 that is perpendicular to the ceiling-based conveyor 20a. Again, the lane jumper 300 may move a FOUP 2 between other conveyors. FIG. 15 illustrates that a FOUP 2 located at position D on the ceiling-based conveyor 20a is configured such that the FOUP door 4 is substantially parallel with the conveyor rails. The FOUP door 4 of the FOUP 2 located at position E on the conveyor 122 is also parallel to the conveyor rails of conveyor 122. In other words, the FOUP 2 has effectively been rotated 90 degrees during transfer from position D to position E. When the conveyors are each located in a position similar to that shown in FIG. 15, the wrist joint 306 of the lane jumper 300 shown in FIG. 15 may remain stationary (is not required to rotate) with respect to the arm 304 during transfer of a FOUP 2 between the ceiling-based conveyor 20a and the pull-over loop conveyor 122. The non rotating wrist joint 306 is possible with a fixed arm length when the conveyors 20a and 122 are positioned such that the arm 304, when rotated 90 degrees (e.g., from position D to position E), can set a FOUP 2 on the conveyor solely through vertical motion. The wrist joint 306 would be required to rotate if, for example, the arm 304 is required to rotate through more or less than 90 degrees.

The various embodiments of the lane jumpers shown in FIGS. 13-15 may be supported in several different ways. For example, a lane-jumper could be supported from a ceiling-based frame or a floor-based frame. Either method of support can be used in connection with both a ceiling-based conveyor and a floor-based conveyor, or from the conveyor structure itself.

It should be appreciated that the above-described mechanisms and methods for FOUP transport between a conveyor and a load port are for explanatory purposes only and that the invention is not limited thereby. Having thus described a preferred embodiment of a method and system for FOUP transportation, it should be apparent to those skilled in the art that certain advantages of the within system have been achieved. It should also be appreciated that various modifications, adaptations, and alternative embodiments thereof may be made within the scope and spirit of the present invention. For example, the use of conveyors has been illustrated in a semiconductor fabrication facility, but it should be apparent that many of the inventive concepts described above would be equally applicable to be used in connection with other non-semiconductor manufacturing applications.

We claim:

1. An apparatus for storing one or more containers and for transporting the one or more containers between a ceiling-based transport system and a floor-based transport system, the apparatus comprising:
    a plurality of vertically stacked storage shelves, each one of the plurality of vertically stacked storage shelves substantially horizontally aligned in a common vertical plane with a section of the ceiling-based transport system that is located directly above an uppermost storage shelf;
    a transfer module comprising,
        a vertically oriented housing; and
        a transfer mechanism configured to move the one or more containers within the vertically oriented housing between the ceiling-based transport system and the uppermost storage shelf;
    a first platform substantially and continuously horizontally aligned in the common vertical plane with the plurality of vertically stacked storage shelves;
    wherein the first platform is configured to vertically move the one or more container among the uppermost storage shelf, one or more of the vertically stacked storage shelves located beneath the uppermost storage shelf, and the floor-based transport system; and
    a second platform substantially and continuously horizontally aligned in the common vertical plane with the plurality of vertically stacked storage shelves;
    wherein the second platform is configured to vertically move the one or more containers among one or more of the vertically stacked storage shelves located beneath the uppermost storage shelf.

2. The apparatus of claim 1, wherein each one of the plurality of vertically stacked storage shelves comprises a conveyor.

3. The apparatus of claim 1, wherein the common vertical plane comprises a first common vertical plane and wherein the ceiling-based transport system comprises:
    an upper transport system substantially horizontally aligned in a second common vertical plane with a lower transport system.

4. The apparatus of claim 1, further comprising a pull-over loop for storing the one or more containers upstream of the transfer module.

5. The apparatus of claim 4, further comprising a lane jumper for transferring the one or more containers between the ceiling-based transport system and the pull-over loop.

6. The apparatus of claim 2, wherein the conveyor comprises a bidirectional conveyor.

7. The apparatus of claim 1, wherein the transfer module comprises a first transfer module, the one or more containers comprise one or more first containers and the apparatus further comprises:
    a second transfer module comprising:
        a second vertically oriented housing; and
        a second transfer mechanism for moving one or more second containers within the second vertically oriented housing between the ceiling-based transport system and the uppermost storage shelf.

8. The apparatus of claim 3, wherein the transfer mechanism is configured to move the one or more containers between the upper transport system, the lower transport system and the uppermost storage shelf.

9. An apparatus for storing one or more containers and for transporting the one or more containers between a ceiling-based transport system and a floor-based transport system, the apparatus comprising:
    a plurality of vertically stacked storage shelves, each one of the plurality of vertically stacked storage shelves substantially horizontally aligned with a section of the ceiling-based transport system that is located directly above an uppermost storage shelf;
    a transfer module comprising
        a vertically oriented housing passing adjacent the ceiling-based transport system, each one of the plurality of vertically stacked storage shelves, and the floor-based transport system;
        a transfer mechanism configured to move the one or more containers within the vertically oriented housing among the ceiling-based transport system, the floor-based transport system, and each one of the plurality of vertically stacked storage shelves;

a first platform substantially and continuously horizontally aligned in a common vertical plane with the plurality of vertically stacked storage shelves;

wherein the first platform is configured to vertically move the one or more containers among the uppermost storage shelf, one or more of the vertically stacked storage shelves located beneath the uppermost storage shelf, and the floor-based transport system; and a second platform substantially and continuously horizontally aligned in the common vertical plane with the plurality of vertically stacked storage shelves, wherein the second platform is configured to vertically move the one or more containers among one or more of the vertically stacked storage shelves located beneath the uppermost storage shelf.

10. The apparatus of claim 9, wherein the transfer module comprises a first transfer module, the one or more containers comprise one or more first containers and the apparatus further comprises:

a second transfer module comprising:

a second vertically oriented housing passing adjacent the ceiling-based transport system and one or more of the plurality of vertically stacked storage shelves; and a second transfer mechanism for moving one or more second containers within the second vertically oriented housing.

11. The apparatus of claim 9, wherein the second platform is configured to vertically move the one or more containers between a first end of a first storage shelf and a second end of a second storage shelve in the plurality of vertically stacked storage shelves.

12. The apparatus of claim 9, wherein each one of the plurality of vertically stacked storage shelves comprises a conveyor.

13. The apparatus of claim 9, further comprising a pullover loop for storing the one or more containers upstream of the transfer module.

14. The apparatus of claim 13, further comprising a lane jumper for transferring the one or more containers between the ceiling-based transport system and the pull-over loop.

15. The apparatus of claim 9, wherein the vertically oriented housing passes adjacent an end of a storage shelf in the plurality of vertically stacked storage shelves.

16. The apparatus of claim 9, further comprising a second plurality of vertically stacked storage shelves.

17. The apparatus of claim 16, wherein each one of the second plurality of vertically stacked storage shelves comprises a conveyor.

18. The apparatus of claim 16, wherein the vertically oriented housing is located between the first plurality of vertically stacked storage shelves and the second plurality of vertically stacked storage shelves.

19. The apparatus of claim 18, wherein the transfer mechanism is configured to move the one or more containers between the ceiling-based transport system, the first plurality of vertically stacked storage shelves, the second plurality of vertically stacked storage shelves and the floor-based transport system.

20. In a fabrication facility having multiple tool bays, each comprising a first processing tool and a second processing tool, a system comprising:

a floor-based intrabay transport system for transporting one or more first containers in a first direction within a tool bay between the first processing tool and the second processing tool;

a ceiling-based interbay transport system for moving one or more second containers along a second direction that is substantially perpendicular to the first direction;

a vertical transport module configured to move one or more third containers between the floor-based intrabay transport system and the ceiling-based interbay transport system;

a first platform substantially and continuously horizontally aligned in a common vertical plane with a plurality of vertically stacked storage shelves located between the floor-based intrabay transport system and the ceiling-based interbay transport system;

wherein the first platform is configured to vertically move the one or more third containers among an uppermost storage shelf, one or more of the vertically stacked storage shelves located beneath the uppermost storage shelf, and the floor-based intrabay transport system; and a second platform substantially and continuously horizontally aligned with in the common vertical plane with the plurality of vertically stacked storage shelves;

wherein the second platform is configured to vertically move the one or more third containers among one or more of the vertically stacked storage shelves located beneath the uppermost storage shelf.

21. The system of claim 20, wherein the floor-based intrabay transport system comprises a conveyor.

22. The system of claim 20, wherein the floor-based intrabay transport system comprises a rail guided vehicle.

23. The system of claim 20, wherein the floor-based interbay transport system comprises an automated guided vehicle.

24. The system of claim 20, wherein the ceiling-based interbay transport system comprises a conveyor.

25. The system of claim 20, wherein the ceiling-based interbay transport system comprises an overhead transport vehicle.

26. The system of claim 20, wherein the ceiling-based interbay transport system comprises an overhead transport shuttle.

27. The system of claim 20, wherein the vertical transport module comprises a first vertical transport module and wherein the system further comprises:

a second vertical transport module configured to move the one or more third containers between the floor-based intrabay transport system and the ceiling-based interbay transport system.

28. In a fabrication facility comprising multiple tool bays, each comprising a first processing tool and a second processing tool, a floor-based intrabay transport system for transporting one or more containers in a first direction within a tool bay between the first processing tool and the second processing tool, and a ceiling-based interbay transport system for moving the one or more containers along a second direction that is substantially perpendicular to the first direction, an apparatus comprising:

a vertical transport module configured to move the one or more containers between the floor-based intrabay transport system and the ceiling-based interbay transport system;

a first platform substantially and continuously horizontally aligned in a common vertical plane with a plurality of vertically stacked storage shelves located between the floor-based intrabay transport system and the ceiling-based interbay transport system;

wherein the first platform is configured to vertically move the one or more containers among an uppermost storage shelf, one or more of the vertically stacked storage shelves located beneath the uppermost storage shelf, and the floor-based intrabay transport system; and a second platform substantially and continuously horizontally aligned in the common vertical plane with the plurality of vertically stacked storage shelves;

wherein the second platform is configured to vertically move the one or more containers among one or more of the vertically stacked storage shelves located beneath the uppermost storage shelf.

29. An apparatus for storing one or more containers and for moving the one or more containers to and from a container transport system, the apparatus comprising:

a plurality of vertically stacked storage shelves;

a transfer module comprising:

a vertically oriented housing located adjacent to the container transport system and one or more of the plurality of vertically stacked storage shelves;

a transfer mechanism for moving the one or more containers within the vertically oriented housing between the container transport system and one or more of the plurality of vertically stacked storage shelves;

a first platform substantially and continuously horizontally aligned in a common vertical plane with the plurality of vertically stacked storage shelves;

wherein the first platform is configured to vertically move the one or more containers among an uppermost storage shelf, one or more of the vertically stacked storage shelves located beneath the uppermost storage shelf, and the container transport system; and a second platform substantially and continuously horizontally aligned in the common vertical plane with the plurality of vertically stacked storage shelves;

wherein the second platform is configured to vertically move the one or more containers among one or more of the vertically stacked storage shelves located beneath the uppermost storage shelf.

30. The apparatus of claim 29, wherein the common vertical plane comprises a first common vertical plane and wherein the plurality of vertically stacked storage shelves are substantially horizontally aligned in a second common vertical plane with a section of the container transport system that is located directly above the uppermost storage shelf.

31. The apparatus of claim 29, wherein the common vertical plane comprises a first common vertical plane and wherein the plurality of vertically stacked storage shelves are substantially horizontally aligned in a second common vertical plane with a section of the container transport system that is located directly beneath a bottommost storage shelf.

* * * * *

UNITED STATES PATENT AND TRADEMARK OFFICE
CERTIFICATE OF CORRECTION

| | | |
|---|---|---|
| PATENT NO. | : 7,798,759 B2 | Page 1 of 1 |
| APPLICATION NO. | : 11/433980 | |
| DATED | : September 21, 2010 | |
| INVENTOR(S) | : Anthony C. Bonora | |

It is certified that error appears in the above-identified patent and that said Letters Patent is hereby corrected as shown below:

On the Title page, Item (73) (Assignee), delete "Kyoto (JP)" and insert --Kyoto, 601-8326 (JP)--, therefor.

Col. 15, Line 62
In Claim 1, delete "comprising," and insert --comprising:--, therefor.

In Claim 1, delete "container" and insert --containers--, therefor.

In Claim 9, delete "comprising" and insert --comprising:--, therefor.

Signed and Sealed this

Seventh Day of December, 2010

David J. Kappos
*Director of the United States Patent and Trademark Office*

UNITED STATES PATENT AND TRADEMARK OFFICE
CERTIFICATE OF CORRECTION

PATENT NO. : 7,798,759 B2  
APPLICATION NO. : 11/433980  
DATED : September 21, 2010  
INVENTOR(S) : Anthony C. Bonora Page 1 of 1

It is certified that error appears in the above-identified patent and that said Letters Patent is hereby corrected as shown below:

On the Title page, Item (73) (Assignee), delete "Kyoto (JP)" and insert --Kyoto, 601-8326 (JP)--, therefor.

Col. 15, Line 62  
In Claim 1, delete "comprising," and insert --comprising:--, therefor.

Col. 16, Line 5  
In Claim 1, delete "container" and insert --containers--, therefor.

Col. 16, Line 58  
In Claim 9, delete "comprising" and insert --comprising:--, therefor.

This certificate supersedes the Certificate of Correction issued December 7, 2010.

Signed and Sealed this  
Twenty-fifth Day of January, 2011

David J. Kappos  
*Director of the United States Patent and Trademark Office*